(12) United States Patent
Desplats et al.

(10) Patent No.: US 6,948,107 B1
(45) Date of Patent: Sep. 20, 2005

(54) METHOD AND INSTALLATION FOR FAST FAULT LOCALIZATION IN AN INTEGRATED CIRCUIT

(75) Inventors: Romain Desplats, Toulouse (FR); Philippe Perdu, Toulouse (FR)

(73) Assignee: Centre National d'Etudes Spatiales (C.N.E.S.), Paris (FR)

( * ) Notice: Subject to any disclaimer, the term of this patent is extended or adjusted under 35 U.S.C. 154(b) by 0 days.

(21) Appl. No.: 09/831,525

(22) PCT Filed: May 21, 1999

(86) PCT No.: PCT/FR99/01212

§ 371 (c)(1),
(2), (4) Date: May 10, 2001

(87) PCT Pub. No.: WO00/29953

PCT Pub. Date: May 25, 2000

(30) Foreign Application Priority Data

Nov. 13, 1998 (FR) .................................. 98 14277

(51) Int. Cl.[7] .......................... G06F 11/00; G06F 7/02; G01R 31/08; G01R 31/28
(52) U.S. Cl. ...................... 714/736; 714/819; 324/523; 327/603
(58) Field of Search ............................. 714/736–738, 714/819; 324/522, 523; 327/603

(56) References Cited

U.S. PATENT DOCUMENTS

| | | | |
|---|---|---|---|
| 5,276,400 A * | 1/1994 | Denyer et al. ............. 324/750 |
| 5,321,354 A | 6/1994 | Ooshima et al. | |
| 5,570,376 A * | 10/1996 | Kunda et al. ................ 714/736 |
| 5,696,788 A * | 12/1997 | Choi et al. ................... 714/736 |
| 5,703,492 A | 12/1997 | Nakamura et al. | |
| 5,726,997 A * | 3/1998 | Teene ......................... 714/726 |
| 5,731,700 A * | 3/1998 | McDonald ............... 324/158.1 |
| 5,790,565 A * | 8/1998 | Sakaguchi ................... 714/738 |
| 5,892,539 A * | 4/1999 | Colvin ......................... 348/80 |

FOREIGN PATENT DOCUMENTS

EP 0 785 513 7/1997

OTHER PUBLICATIONS

May et al. "Dynamic Fault Imaging of VSLI Random Logic Devices", IEEE, International Reliability Physics Symposium, pp. 95-108, 1984.
Kuji et al. "E-beam Static Fault Imaging with a CAD Interface and Its Application to Marginal Fault Diagnosis," IEICE Transactions on Electronics, vol. E77-C, No. 4, pp. 552-559, 1994.
Nakamae et al. "Efficient Dynamic Fault Imaging by Fully Utilising CAD Data in CAD-linked Electron Beam Test Systems," IEICE Transactions on Electronics, vol. E77-C, No. 4, pp. 546-551, 1994.

(Continued)

Primary Examiner—Albert Decady
Assistant Examiner—Cynthia Britt
(74) Attorney, Agent, or Firm—Young & Thompson

(57) ABSTRACT

The invention relates to a method and an installation for fast location of a fault in an integrated circuit. A sequence of NRZ location vectors is created, the abnormal location vectors are determined, for which the value of the electrical consumption current at rest IDDQ of the circuit is abnormal, at least one set of images is produced with an abnormal location vector, and at least one abnormal vector image is compared with a reference image.

35 Claims, 13 Drawing Sheets

OTHER PUBLICATIONS

Nakamura et al. "LSI Fast Fault Localisation by Continuously Gated Fault Imaging Method," NEC Research & Development, vol. 35, No. 3, pp. 269-277, 1994.

Geraud-Liria et al. "Failure Analysis by Dynamic Voltage Contrast Development of a Semi-Automatic System," ISTFA 1987, Los Angeles, pp. 67-73.

Perdu. "Etude de circuits integres par contraste de potentiel : analyse des phenomenes de charge induits dans la couche de passivation," These de doctorate de l'UNIVERSITE Paul Sabatier, No. 1740, pp. 37-50, 1994.

Desplats et al. "High Speed Failure Localization With a New Application of $I_{DDQ}$ Testing" May 25, 1998.

Desplats et al. "Shorter Failure Analysis Using a New Application of $I_{DDQ}$ for Defect Localization in ICs," Sep. 1998.

* cited by examiner

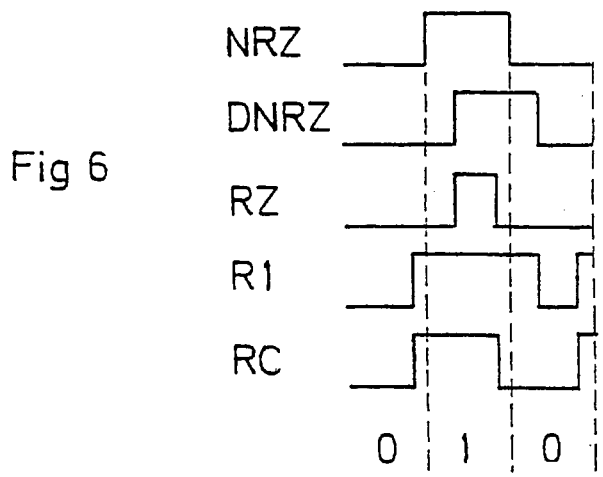
Fig 6
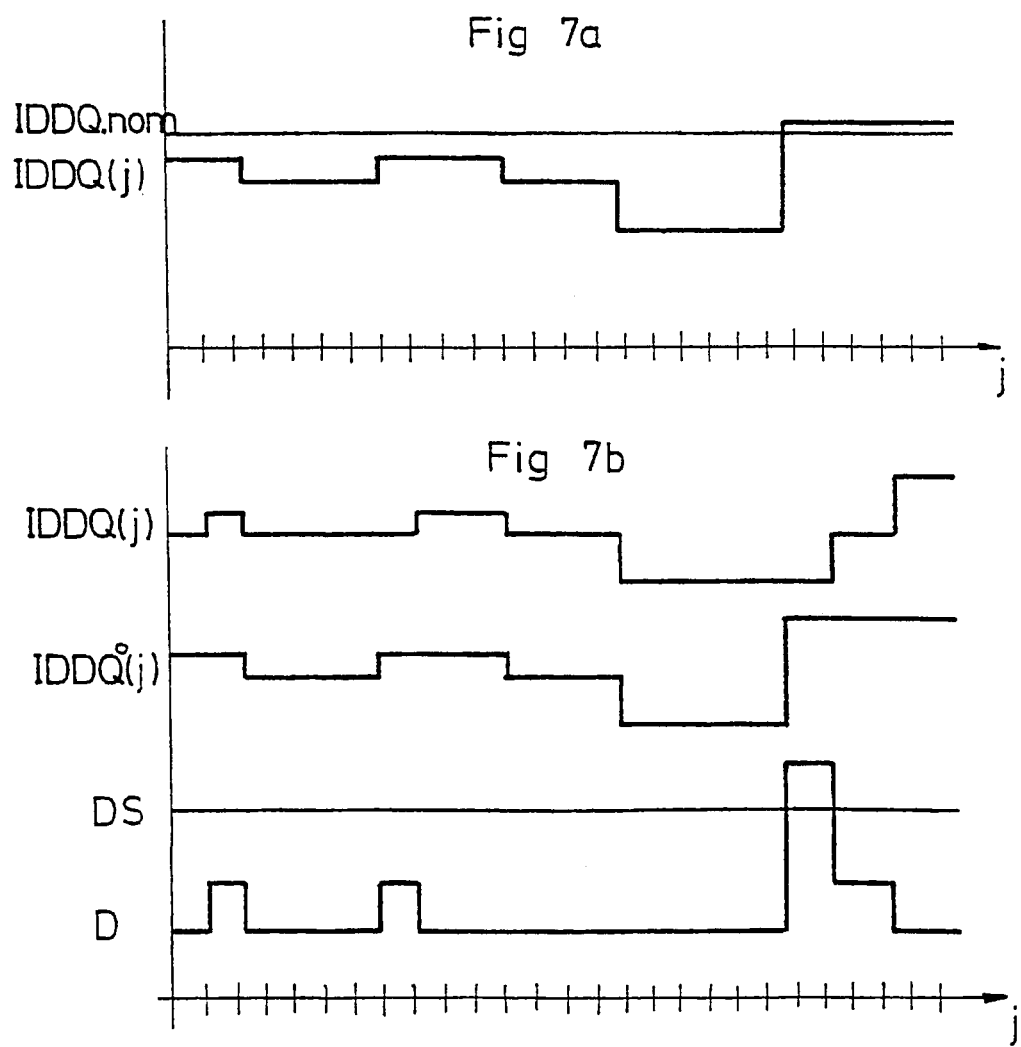

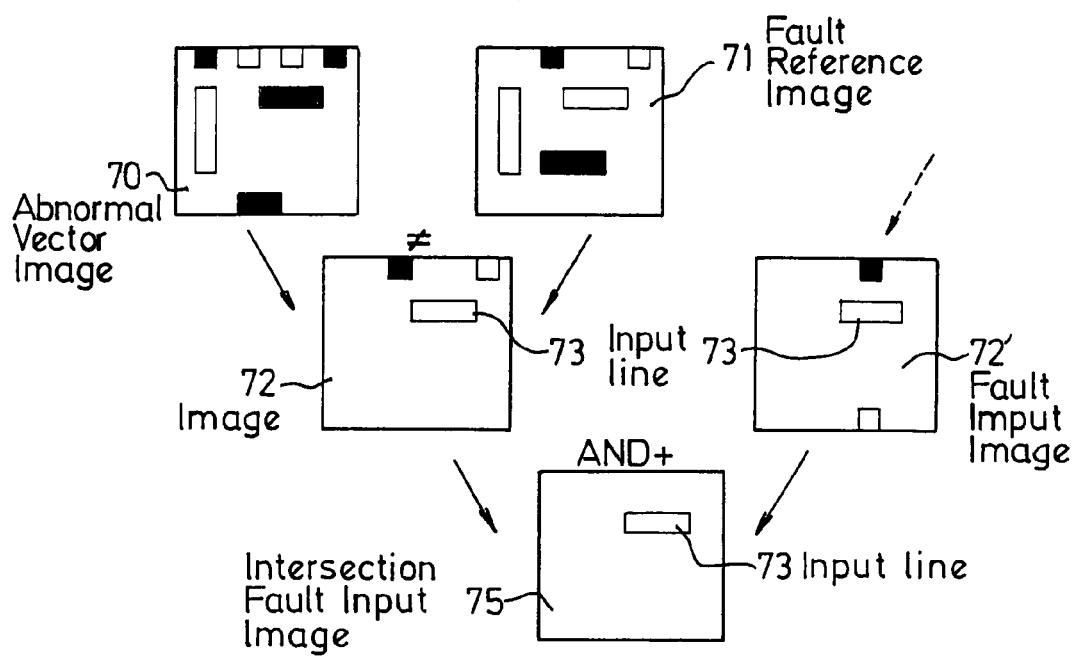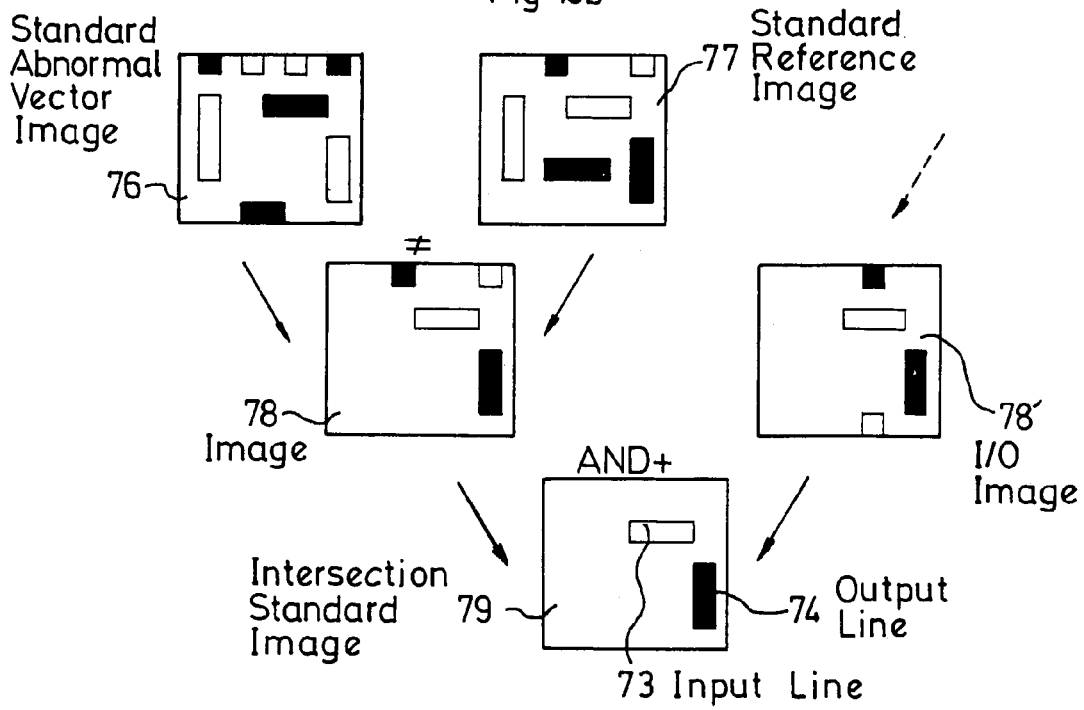

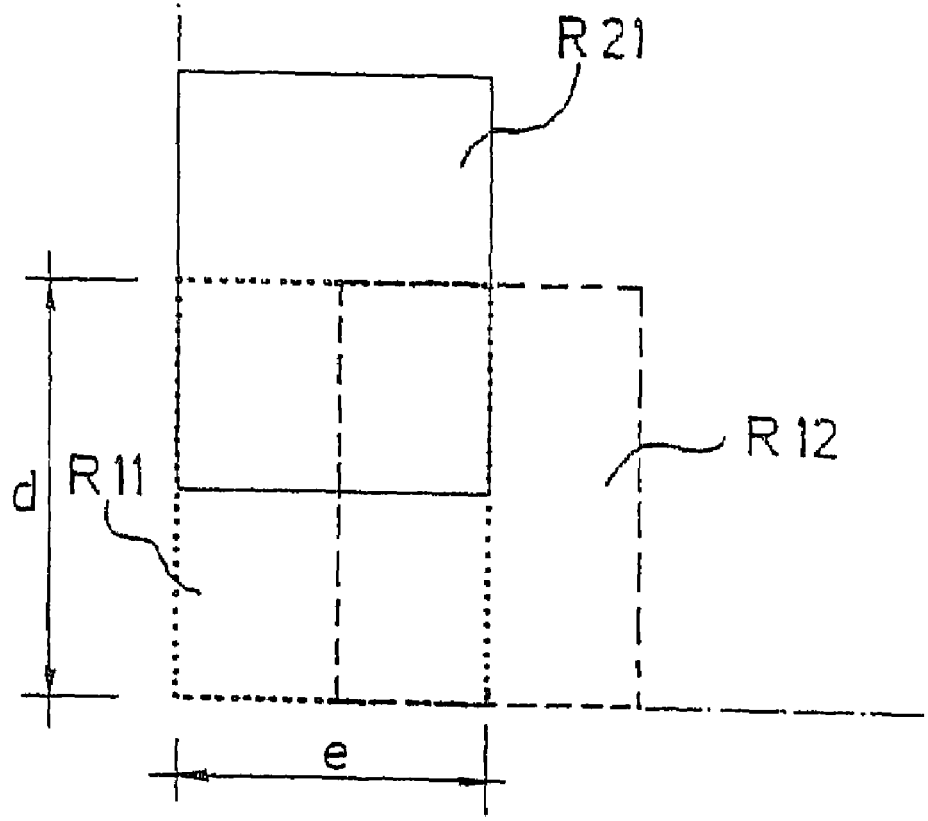
e = image width
d = image length
Rik = image rectangles

METHOD AND INSTALLATION FOR FAST FAULT LOCALIZATION IN AN INTEGRATED CIRCUIT

BACKGROUND OF THE INVENTION

The invention relates to a method and an installation for fast location of a fault in an integrated circuit, such as an integrated logic circuit.

DESCRIPTION OF THE RELATED ART

Despite the progress made in the design and manufacturing of integrated circuits, many faults affect the manufacturing performance or reliability of the printed circuits. These are mainly manufacturing or design faults. Thus, a large proportion (approximately 15%) of the circuits obtained from the initial series of manufacturing by foundry (successive depositing operations using masks) is not functional, and has faults. This proportion increases with the complexity and high degree of integration of the integrated circuits, which are known as LSI or VLSI, and with the miniaturisation of the circuits. The development of the industrial production of an integrated circuit therefore makes it necessary to produce beforehand some prototype batches, which are tested in order to verify their actual electrical characteristics. Certain faults can be revealed by these tests, or subsequently during use of the integrated circuits, throughout their service life.

This applies both to mass-produced commercial integrated circuits and to specific integrated circuits (ASIC).

When an integrated circuit tested is found to be defective, it is then important, in a second step, to be able locate very accurately within the chip of the integrated circuit the fault which has given rise to the functional defectiveness. In fact, this location makes it possible to determine the actual cause of the defectiveness, and thus to take the appropriate corrective measures.

Thus, it must be possible to carry out the location of the faults in the integrated circuits from the stages of design (debugging), manufacturing (for validation), quality control (for production), up to that of analysis of the faults in the finished integrated circuits by the final user.

It must be possible to carry out as quickly as possible the operations which are necessary for location of the faults. In fact, it is known that the periods of time for design and manufacture of the printed circuits represent one of the most important strategic factors in the development of high-technology industries, both for the manufacturers of integrated circuits and for their clients, such as the space industry.

Thus, taking into account the competition which exists in this field, the success of a space project, such as launching a satellite, is closely associated with the performance, cost, reliability and quality of the components used, including the integrated logic circuits, which determine the technical and economic advantage and feasibility of the project.

Printed circuits with a high level of integration (LSI or VLSI) can be produced according to different technologies, i.e. MOS circuits (including the CMOS circuits which are used in space systems, taking into account their very low electrical consumption); bipolar circuits; BICMOS circuits; etc).

These circuits are increasingly complex, and have ever increasing density of integration (which doubles virtually every 18 months, according to the law established by Gordon Moore). The integrated circuits can now thus incorporate several hundred terminals, and several million logic gates consisting of transistors. Consequently, location of faults is increasingly difficult and lengthy.

Many techniques have been developed for the location of faults.

During manufacture, there is access to design data bases (CAD), and to simulation systems. Different methods for location have been proposed, based on a comparison with a fault dictionary or simulation data.

However, since these data are not available under all circumstances, methods have been proposed which are based on the comparison of images, in relation to a fault-free reference circuit, which is designated throughout the text as the "standard circuit". In order to acquire these images, several technologies have been envisaged.

Optical microscopy has resolution which cannot be better than $1\mu$, and is no longer compatible with the surface area, the number of levels of interconnections, and the power distribution planes of the chips in modern circuits. In addition, the faults are located by visual inspection.

Many techniques use imagery by means of electron-microscopy scanning. The methods use liquid crystals, which make it possible to display the hot spots and the holes in the oxides. The emissive faults (grid oxide break-through, damaged pn junctions; saturated MOS transistors, etc) can be located by light-emission microscopy. Other methods make it possible to compare the potentials at different points of the circuit, i.e. micro-point test, opto-electronic devices, laser potential induced measurement, scanning-sensor microscopy, fluorescent microthermographic imagery, etc.

These methods are mostly cumbersome and lengthy to implement. Several of them are still reserved for laboratory use, and are not yet available on an industrial scale.

It has also already been proposed in 1984 ("Dynamic fault imaging of VLSI random logic devices" T. C. MAY et al, IEEE, International Reliability Physics Symposium, pp 95–108, 1984), to locate faults of the short-circuit type by means of microscopic images by contrast of potential.

The first method proposed, known as dynamic fault imaging (DFI) consisted of comparing the images of the defective circuit and of the reference circuit in a stroboscopic manner. The search strategy, known as backtracing, consisted of searching for the defective gate by going back in time over the sequence of test vectors, starting from the functional appearance of the fault at an output terminal of the circuit. This method is limited by the time of acquisition of each image, of approximately 20 minutes.

It has been proposed to acquire these images in real time, in order to reduce this duration of acquisition to a few seconds ("E-beam static fault imaging with a CAD interface and its application to marginal fault diagnosis", N. KUJI et al, IEICE Transactions on Electronics v E77-C, mo. 4, pp 552–559, 1994). The problem with this method, which is known as static fault imaging (SFI) is that it makes it necessary to have available the drawing of the design data base masks (layout), which is not always possible. In addition, the circuits must be depassivated, in order to eliminate the problem of the effect of discharge, which makes the contrast disappear.

Optimisations of these methods, DFI or SFI, have been proposed, i.e. the method which is known as TSFI: "Efficient dynamic fault imaging by fully utilising CAD data in CAD-linked electron beam test systems", K. NAKAMAE et al., IEICE Transactions on Electronics, v E77-C, no. 4, pp 546, 551, 1994; and the method which is known as CGFI: "LSI fast fault localisation by continuously gated fault imaging method", T. T. NAKAMURA et al, NEC Research & Development, v 35, no. 3, pp 269–277, 1994.

U.S. Pat. No. 5,703,492 also describes a method in which it is attempted to eliminate the problem of the large number of images to be produced, and to record without storing the images, but by displaying in real time, alternately or simultaneously, an image of an area of the entire surface of the chip of the defective circuit and of the non-defective standard circuit, such that these images are superimposed and compared in real time, by visual examination by a human operator, without being stored.

The publications "Failure analysis by dynamic voltage contrast development of a semi-automatic system", N. GERAUD-LINIA et al, ISTFA 1987, Los Angeles, pp 67–73; "Study of integrated circuits by contrast of potential: analysis of the charge phenomena induced in the passivation layer", doctoral thesis at PAUL SABATIER UNIVERSITY, by Philippe PERDU, no. 1740, pp 37–50, 1994, describe a semi-automatic method which consists of observing the defective circuit and a standard circuit in a static manner and in a dynamic manner, from a sequence of test vectors selected such that the defective circuit exhibits a fault at the output, after the final test vector has been applied. In practice, this sequence corresponds to that which made it possible to detect the fault during a prior test step.

As stated in this last document, location of the fault in the case of sequential logic circuits poses a problem, and is very lengthy and difficult. The same applies to all the circuits which do not use combinational logic alone. In fact, it is necessary to record sets of images for each vector in the sequence of test vectors applied to the input terminals of the circuit, both for the defective circuit and for the standard circuit. A comparison must then be made by superimposition of the images which have not been produced using the same circuit, or under the same experimental conditions.

As stated in this last document, processing of the images always requires human intervention, in order, according to the quality and nature of each image, to select the processing which will be applied to the image, and to carry out the locating by visual inspection of the images superimposed.

A semi-automatic method of execution known as image fault analysis (IFA) has also been developed, for application of the CGFI method to systems for testing by means of electron beams, known as IDS, which are marketed by the company SCHLUMBERGER TECHNOLOGIES (FRANCE). The IFA method can be "automatic" (all of the images of the vectors are acquired), or it can be combined with searching which is recurrent (backtracing), or is by dichotomy.

All these methods pose two main problems, which limit the performance and the practical applications, i.e. they are too lengthy, and/or they are impossible to put into practice, taking into account faults of alignment of the circuits.

Thus, when using these methods, it is necessary to process, then superimpose, for many vectors, all the images of the defective circuit and of the standard circuit, which is an extremely lengthy process. For example, with a 100 mm² chip in 1$\mu$ technology, and a number of grid compartments of 100 and 1000 vectors, the IFA method requires 1,000,000 images in automatic, 600 images with a recurrent search, and 100 images with a search by simple dichotomy.

In addition, when the occurrence of the fault is detected by examining the electrical functionality of the output terminals according to the input signals (recurrent search), it is necessary to examine and compare respectively the images of the preceding vectors in the sequence, in order to reach the images in which the defective logic gate of the circuit, which gave rise to the functional fault at the output, is displayed. In addition to the fact that this retrospective examination is lengthy, it is never certain that the images examined are those which make it possible to display the defective logic gate which gave rise to the functional fault.

Thus, the information which is obtained in these prior methods must almost always be combined with information obtained from software simulation methods, with the aim of recreating the fault by means of successive hypotheses and/or using the design drawings of the layout circuit.

Consequently, location of a fault in these conditions requires in practice a very lengthy period of time, which, for each circuit, is one or more days, and can be as much as several weeks for the most complex integrated circuits.

In addition, at least some of these prior methods, in particular those which consist of acquiring and comparing the images directly in real time without any processing (U.S. Pat. No. 5,703,492), are impossible to implement in practice. In fact, the comparison of images of two different circuits presupposes that it is possible to align perfectly the two circuits compared, and thus disregards the real conditions of observation of the two circuits, which cannot be identical in practice. A simple difference of thickness of glue between the two chips, or differences of deformation of the two circuits during acquisition of the images, is sufficient to prevent any relevant comparison of the images.

Furthermore, the prior methods do not permit the location of slight faults which do not take the form of a fault of electrical functionality at the output terminals. A significant proportion of the deferred defects of the circuits, when they are being used, is derived from slight faults of this type.

An integrated circuit comprises a chip, input terminals and output terminals, which are connected to one another by electrically conductive tracks and logic gates formed within the chip of the integrated circuit, which is generally in the form of a wafer defining a main plane of the chip, the tracks extending in the thickness of the chip or on the surface, globally parallel to the main plane, the input and output terminals being connected to the tracks at the periphery of the chip, and at least two electrical energy supply terminals with direct voltage (VDD-VSS), at least one supply terminal of which is connected to a high potential VDD, and at least one supply terminal of which is connected to a low potential VSS.

Throughout the text, "fault of the short-circuit type" designates any fault in the chip which creates, or can subsequently create, excess consumption of electric supply current of the circuit. This can consist of sticking or pseudo sticking of a logic gate, a leakage of current in a logic gate, bridging between tracks, etc. According to the manufacturers of integrated circuits, it is known that more than 80% of the faults in integrated circuits are faults of the short-circuit type in the chip. This expression does not incorporate the faults outside the chip itself, or those which affect only the currents of the input and/or output terminals of the circuit.

The "equipotential input line" of a logic gate designates the entire network of conductive tracks which have the same electrical potential, and extend between this logic gate, and one or a plurality of input terminals; or between this logic gate, and, if it exists, at least one other logic gate, from which it receives the signal(s) obtained from the/one of the input terminal(s). Similarly, the "equipotential output line" of a logic gate designates the entire network of conductive tracks which have the same electrical potential, and extend between this logic gate, and one or a plurality of output terminals; or between this logic gate, and, if it exists, at least one other logic gate, to which it supplies a signal destined for the/one of the output terminal(s).

SUMMARY OF THE INVENTION

The invention is thus aimed at eliminating the aforementioned disadvantages, and at proposing a method which makes it possible to locate a fault of the short-circuit type in a defective logic gate of a defective integrated circuit, which is much faster than in the past, and which in particular can be carried out within a period of far less than a day, including in the case of complex integrated circuits, this duration being in general less than 1 h.

The object of the invention is also to permit location of a fault by comparison of images of at least one circuit, i.e. of the defective circuit and/or of a standard circuit.

The object of the invention is in particular to limit considerably the number of comparisons of images to be produced, in order to isolate the defective logic gate.

The object of the invention is also to automate as far as possible this comparison of images, and the method for location, by reducing human intervention to a minimum. The object of the invention is in particular to permit analysis of images for location of the defective logic gate, which can be executed systematically by means of a computer system.

The object of the invention is also to make it possible to form an image which represents only the defective logic gate, and/or the equipotential input line, and/or the equipotential output line of the defective logic gate.

The object of the invention is also to permit fast location of a defective logic gate by imagery itself, in the case of the sequential circuits, by permitting fast production of at least one image which represents the defective logic gate in the defective state.

The object of the invention is to permit location of a fault, including when the defective circuit has the same electronic functionalities as a standard circuit, i.e. when the fault cannot be detected on the output terminals of the defective circuit.

The object of the invention is in particular to permit location of defective logic gates which do not detract from the electronic functionality of the circuit, the signals received at the output terminals being considered as correct.

The object of the invention is also to permit location of a fault of a defective integrated circuit, which has previously undergone a test step, which has led to disclosure of the defectiveness of the circuit.

The object of the invention is also to propose an installation for implementation of the method according to the invention.

The invention also relates to a method for location of a fault of the short-circuit type in a logic gate, known as the defective logic gate, of an integrated circuit, known as the defective integrated circuit, wherein:

a sequence of distinct vectors, known as location vectors, is created and recorded, each of which is formed from a series of signals, which are designed to be able to be applied to the different input terminals of the defective circuit;

for at least one location vector applied to the input terminals of the defective circuit and/or of an integrated circuit, known as the standard circuit, which is free from a defective gate and from any fault, and is also identical to the defective circuit, a set of images, known as vector images, is produced and recorded, representing equipotential lines formed by the tracks and the logic gates of the said circuit, each equipotential line corresponding to one of the differentiated states of potential on the vector images, the different vector images of a single set of images being designed to cover and represent the entire surface of the chip, or an entire portion of this surface on which it is being attempted to locate the defective logic gate, in which;

each location vector is formed from binary signals which assume one of the logic states 0 and 1, and maintain this logic state throughout an entire period, in which it is considered that the location vector is applied to the input terminals, such that this sequence can be applied step by step, one location vector after the other, and keeping each location vector applied for a period which is as long as necessary at the input terminals of the defective circuit and/or of a standard circuit, without the electric state of this circuit changing during this period;

the sequence of location vectors is applied step by step to the input terminals of the defective circuit, and for each location vector, measurement is made of the value IDDQ(j) of the electrical consumption current at rest IDDQ of the defective circuit, which is circulating in at least one of the supply terminals, and it is determined whether this value measured IDDQ(j) is normal or abnormal, and the result of this determination is recorded;

at least one location vector, known as the abnormal location vector, is applied to the input terminals of the defective circuit and/or of a standard circuit, for which the fact has previously been determined and recorded that the value measured IDDQ(j) of the electrical consumption current at rest IDDQ of the defective circuit is abnormal, and a set of images, known as abnormal vector images, of the said circuit with this abnormal location vector is produced and recorded; and in a further step of location of the defective gate, at least one comparison is made between at least one abnormal vector image and another pre-recorded image, known as the reference image, corresponding to the same portion of surface of the chip of the defective circuit or of the standard circuit as the abnormal vector image, these images being selected such that this comparison makes it possible to select an area, known as the defective area, of the surface of the chip on which there can be located an equipotential input line of the defective logic gate and/or an equipotential output line of the defective logic gate, and/or the defective logic gate.

In the invention, the sequence of vectors used is a specific sequence, which is more complex than in the prior art. In fact, this sequence, which is formed from signal vectors with the format known as NRZ (without return to the initial state during application of a command), comprises a larger number of vectors than the sequences of test vectors which are conventionally in the format RTZ or RTO (return to zero). Despite this, the inventors have determined that, far from slowing down location of the fault, this more complex sequence, which requires prior processing, on the contrary makes it possible to improve the performance in terms of speed and reliability. In fact, this sequence can then be applied in step by step mode, and makes it possible to identify with certainty the first modification of logic state of the circuit (i.e. the first vector), by exciting the defective gate, simply by measurement of the current IDDQ, and then to produce the vector images which correspond exactly to this excitation of the defective gate, without any possible error, including in the case of a sequential logic circuit and a slight non-functional fault.

It should be noted that, within the context of the simple defectiveness tests carried out prior to any fault analysis or location, a known test method consists of measurement of the electrical consumption current at rest IDDQ of the integrated circuit, whereas test vectors are applied to the input terminals of the circuit, according to a sequence which is carried out continuously. If the value measured exceeds a pre-determined threshold value, the circuit is considered to be defective. Otherwise, it is considered as nominal. The sequence of test vectors is determined such as to be as fast as possible (minimum number of vectors), whilst providing test cover for the optimal current IDDQ (with examination of all the cases of electronic functions). With these test methods, it is not possible to record current measurements IDDQ for each test vector, and no imagery is produced. In addition, each test vector is in the format of the tracks of the input terminals (RTZ, RTO, etc), and the values of the input signals can vary during the same test vector. Consequently, the solutions designed for test methods of this type could not be applied a priori to fault location. This is therefore all the more true in the case of fault location by imagery with contrast of potential, in which electrical potentials are detected rather than electric currents.

On the other hand, in the invention, the sequence of location vectors is designed to be executed step by step, and in order to permit measurement of the consumption current IDDQ, without changing the electrical state of the circuit during this measurement. As a result, the function of the value of the current IDDQ is not to detect the existence of a fault, but, with the sequence of location vectors, to reproduce the first and each electrical change which produces the fault, and to record each corresponding abnormal location vector. It is then possible to acquire and record the images which correspond to an abnormal location vector of this type, which speeds up considerably the location of the defective gate.

Advantageously and according to the invention, the following steps are executed chronologically:
  in a first step, the sequence of location vectors is created and recorded;
  in a second step, there is application step by step of the sequence of location vectors, to the input terminals of the defective circuit, the value IDDQ(j) is measured of the electrical consumption current at rest IDDQ of the defective circuit, for each location vector, it is determined whether the location vector is abnormal, and this information is recorded;
  in a third step, there is selection and recording from amongst the sequence of location vectors, of a list of location vectors which is designed to produce the vector images which make it possible to locate the defective gate by comparison;
  in a fourth step, there is application, sequentially, step by step, of the list of location vectors, to the input terminals of the defective circuit and/or of a standard circuit, and a set of vector images for the location vectors of this list is produced and recorded; and
  in a fifth step, the step of location of the defective gate is carried out by using the vector images produced in the fourth step.

Advantageously and according to the invention, each location vector is formed by binary signals with the format NRZ, which maintain the same logic state (0 or 1), until a subsequent location vector is applied to the input terminals, or, if the final location vector is involved, until completion of the measurement(s) and production of image(s) carried out for this location vector. Advantageously and according to the invention, the sequence of location vectors is created from a sequence of vectors, known as test vectors, which is previously formed and recorded, and is designed to make it possible to determine the existence only of a defective gate in the defective circuit, by measurement of the value of the electrical consumption current at rest IDDQ of the defective circuit, and each test vector for which the binary signal of at least one input terminal is liable to change its logic state, is broken down into a plurality of location vectors, the logic state of the binary signals of which does not change. In other words, there is conversion of the sequence of test vectors which has made it possible to detect the existence of a fault, into a sequence of location vectors with the format NRZ.

Advantageously and according to the invention, the sequence of location vectors is created such that two consecutive location vectors are distinguished from one another by the value of a single binary signal applied to a single input terminal. This last variant has in particular the advantage of speeding up further the selection of the equipotential line(s) corresponding to the defective gate.

Advantageously and according to the invention, before the value of the consumption current at rest IDDQ is measured, the value of the currents which are circulating in the input and output terminals of the circuit are measured, in order to ensure that the fault is actually located on the chip.

Advantageously and according to the invention, in order to measure the value of the electrical consumption current at rest IDDQ of the defective circuit, at least one supply terminal, and in particular the said supply terminal which is connected to a low potential VSS, of the defective circuit, is applied to the input of an amplifier circuit which is fitted as a current/voltage converter. Advantageously, the said supply terminal connected to a low potential VSS is used, and the amplifier circuit fitted is a current/voltage converter, and is designed to create a virtual memory, which is adjustable according to the constraints imposed by the supply of the integrated circuit on which the value of the current IDDQ is measured.

In addition, advantageously and according to the invention, it is determined whether the value measured IDDQ(j) is normal or abnormal, by comparing it with a known nominal electrical consumption current at rest IDDQnom of the defective circuit. This variant is possible when the nominal value of its consumption current at rest IDDQ is already known.

In another variant, advantageously and according to the invention, it is determined whether the value measured IDDQ(j) is normal or abnormal, by calculating the standardised difference:

$$D=[IDDQ(j)-IDDQ^{0}(j)]/\mathrm{maximum}[IDDQ^{0}(j),Imin]$$

in which:
  IDDQ(j) is the value measured of the electrical consumption current at rest IDDQ, of the defective circuit with the test vector j;
  $IDDQ^{0}(j)$ is the value measured of the electrical consumption current at rest IDDQ, of a standard circuit; and
  Imin is a minimum current value which is pre-determined in order to eliminate the effects of noise. The value IDDQ(j) is considered to be abnormal if D is greater than a pre-determined threshold value DS. Advantageously and according to the invention, DS is selected between 2 and 100.

Advantageously and according to the invention, after a first comparison has been made, in which at least one defective area of the surface of the chip has been selected, at least one further comparison is made, only from vector images which correspond to the said defective area. Advantageously and according to the invention, for an abnormal location vector, a comparison is made of two sets of images of the defective circuit and/or of a standard circuit, at least one of the two sets of images being a set of vector images which is obtained with the said abnormal location vector, such as to select a defective area in which the defective logic gate can be located, and a further comparison is subsequently made only with the sets of vector images which represent the said defective area.

Advantageously and according to the invention, during a first comparison of the step of location of the fault, the abnormal vector image used is at least one vector image of a set of vector images, obtained with the first abnormal location vector appearing first in the sequence of location vectors. In fact, it is then known that all the preceding location vectors are normal, which facilitates further the search strategy.

In the case in particular of a defective gate which produces an electrical function fault at one output terminal at least of the circuit, the following procedure can be adopted.

Advantageously and according to the invention, the electrical functionality of the defective circuit is tested, and, if the defective circuit is found to be non-functional as far as one output terminal at least is concerned, as the reference image, use is made of a vector image, known as the fault reference image, obtained with the defective circuit for a location vector, known as the normal location vector, for which the value measured of the consumption current at rest IDDQ of the defective circuit, is normal. Advantageously and according to the invention, the fault reference image used is a vector image which is obtained with the defective circuit, in the same sequence of location vectors, with a location vector which precedes the abnormal location vector. These location vectors used are recorded in the list of vectors selected in the sequence in order to permit the location.

Advantageously and according to the invention, for a comparison, the abnormal vector image used is a vector image, known as the fault abnormal vector image, of the defective circuit, and, in order to compare the fault abnormal vector image and the fault reference image, an image is formed, known as the simple fault input image, representing the equipotential lines of the defective circuit which have the same form and the same location, and states of potential which differ between the fault abnormal vector image and the fault reference image, such as to be representative of the equipotential input line of the defective logic gate.

Advantageously and according to the invention, a plurality of simple fault input images is formed from a single fault abnormal vector image, which is compared with a plurality of fault reference images, and an image is formed, known as the intersection fault input image, representing the equipotential lines which are common (same form, location and state of potential) amongst the different simple fault input images. It should be noted that only the defective circuit is used to locate the input equipotential.

In addition, the invention makes it possible to locate the output equipotential. Thus, advantageously and according to the invention, during the step of location of the defective gate, at least one comparison is made between two images of a standard circuit formed from an abnormal vector image, known as the standard abnormal vector image, obtained by applying an abnormal location vector to this standard circuit, and from a reference image, known as the standard reference image, obtained by applying a normal location vector to the standard circuit. Advantageously and according to the invention, on the basis of the standard abnormal vector image and the standard reference image, an image is formed, known as the simple standard input/output image, representing the equipotential lines of the standard circuit which have the same form and the same location, and states of potential which differ between the standard abnormal vector image and the standard reference image, such as to be representative of the equipotential input line and the equipotential output line of the defective logic gate of the defective circuit.

Advantageously and according to the invention, a plurality of simple standard input/output images is formed from a single standard abnormal vector image, which is compared with a plurality of standard reference images, and an image is formed, known as the intersection standard input/output image, representing the equipotential lines which are common amongst the different simple standard input/output images. Advantageously and according to the invention, during a further comparison, an image is formed, known as the output image, representing the equipotential lines which appear on a simple fault input image or on an intersection fault input image, or on a simple standard input/output image, or on an intersection standard input/output image, with the exclusion of the equipotential lines which are common amongst these images, this output image representing the equipotential output line of the defective logic gate, and its propagation in the defective circuit. In order to locate the defective logic gate, advantageously and according to the invention, there is division of an intersection or simple fault input image and an output image representing the same portion of surface of the chip, in adjacent rectangular windows which have the same pre-determined fixed dimensions, which are smaller than those of these images, for each window it is examined whether each of the two images does or does not have at least one equipotential line, and the window(s) having at least one equipotential line in each of these two images is/are selected and recorded.

In the case of a defective logic gate which does not produce a functional fault at an output terminal, the following procedure can be adopted.

Advantageously and according to the invention, the electrical functionality of the defective circuit is tested, and, if the defective circuit is found to be functional for all the output terminals, a comparison is made between at least one first abnormal vector image obtained with a first abnormal location vector, and at least one second abnormal vector image obtained with the same circuit, and with a second abnormal location vector which is distinct from the first abnormal location vector, the first and second abnormal location vectors belonging to the same sequence of location vectors. Advantageously and according to the invention, an image is formed, known as the fault output image, representing the equipotential line(s) which is/are common to the different abnormal vector images, comprising the equipotential output line of the defective logic gate. Advantageously and according to the invention, in a further comparison, an image is formed, known as the intermediate output image, representing the equipotential lines which appear in common on the fault output image and on at least one normal vector image obtained with a normal location vector, with the exclusion of the equipotential lines which are common to this fault output image and this normal vector image, the said intermediate output image comprising the equipotential output line of the defective logic gate. Advantageously and according to the invention, in a further comparison, an image is formed, known as the output image, which represents the equipotential lines common to the fault output image and to the intermediate output image, the said output image representing the equipotential output line of the defective logic gate.

In addition, advantageously and according to the invention, the test images are produced by electronic scanning microscopy with contrast of potential, by detection of the secondary electrons. Any other method which provides contrasted images which are representative of the levels of potential can be used as a variant. Advantageously and according to the invention, the vector images are recorded in monochrome pixelised form, and each comparison is made between images in pixelised form, numerically, pixel by pixel.

In addition, advantageously and according to the invention, before using an image in an image comparison step, this image is previously integrated onto a plurality of identical exposures which correspond to this image, and median filtering is carried out by allocating to each pixel the median value of the series of pixels comprising this pixel and the pixels which surround it, such as to eliminate the peaks caused by the noise.

In addition, advantageously and according to the invention, in order to form an image representing the equipotential lines which have the same form and the same location, and states of potential which differ between two initial images, a difference in the two initial images is produced pixel by pixel, according to the formula:

$$PC=(PA-PB)/2+INT(E/2)$$

in which PA is the value of the contrast level of the pixel of the first input image; PB is the value of the contrast level of the pixel of the second input image; E is the maximum value of the contrast level of the images; PC is the value of the contrast level of the pixel of the image formed; and INT is the whole part function. Conventionally, E is 255, the images comprising 256 contrast levels from 0 to 255.

In addition, advantageously and according to the invention, in order to form an image representing the common equipotential lines which are common (same form, location and state of potential) to two initial images, there are carried out:

a thresholding step, which adapts to three contrast levels, i.e. white, black and grey, of values which correspond respectively to E, 0 and to a value which is at least substantially median between 0 and E, and in particular INT(E/2); and pixel by pixel, an extended AND+ intersection, during which the following contrast levels are allocated to each pixel of the image to be formed:

black (0), if the two pixels of the initial images are black on completion of the adaptive thresholding;

white (E), if the two pixels of the initial images are white on completion of the adaptive thresholding; and grey (INT(E/2)) in all the other cases.

Similarly, advantageously and according to the invention, in order to form an image which represents the equipotential lines of one or the other of two initial images, with the exclusion of the equipotential lines which are common to these two initial images, there are carried out:

a thresholding step, which adapts to three contrast levels, i.e. white, black and grey; and pixel by pixel, an extended exclusive OR comparison, XOR+, during which the following contrast levels are allocated to each pixel of the image to be formed:

grey (INT(E/2)), if the two pixels of the initial images have the same contrast value on completion of the adaptive thresholding;

white (E) if the two pixels of the initial images are white and grey; or white and black; or grey and black, on completion of the adaptive thresholding; and black (0) if the two pixels of the initial images are black and grey; or black and white; or grey and white.

More generally, advantageously and according to the invention, when it is wished to compare two images, one of which is representative of the defective circuit, whereas the other is representative of a standard circuit, prior processing is carried out of images comprising an adaptive thresholding step, pixel by pixel, at three contrast levels, i.e. white, black and grey.

The invention extends to an installation for implementing a method according to the invention.

The invention thus relates to an installation for location of a fault of the short-circuit type, in a logic gate, known as the defective logic gate, of an integrated circuit, known as the defective integrated circuit, comprising a chip for the input terminals and output terminals, which are connected to one another by electrically conductive tracks and logic gates formed within the chip of the integrated circuit, which is generally in the form of a wafer defining a main plane of the chip, the tracks extending in the thickness of the chip or on the surface, globally parallel to the main plane, the input and output terminals being connected to the tracks at the periphery of the chip, and at least two electrical energy supply terminals with direct voltage (VDD-VSS), at least one supply terminal of which is connected to a high potential VDD, and at least one supply terminal of which is connected to a low potential VSS, the said installation comprising:

means for creating and recording a sequence of vectors, known as location vectors, each of which is formed from a series of signals, which are designed to be able to be applied to the different input terminals of the defective circuit;

equipotential imagery means, which, for at least one location vector applied to the input terminals of the defective circuit and/or of an integrated circuit, known as the standard circuit, which is free from a defective gate and from any fault, and is also identical to the defective circuit, can produce and record a set of images, known as vector images, representing equipotential lines formed by the tracks and the logic gates of the said circuit, each equipotential line corresponding to one of the differentiated states of potential on the vector images, the different vector images of a single set of images being designed to cover and represent the entire surface of the chip, or an entire portion of this surface on which it is being attempted to locate the defective logic gate, wherein it comprises;

means for formation of a sequence of location vectors, in which each location vector is formed from binary signals which assume one of the logic states 0 and 1, and maintain this logic state throughout an entire period, in which it is considered that the location vector is applied to the input terminals;

means for applying the sequence of location vectors step by step to the input terminals of the defective circuit; and for each location vector, means for measurement of the value IDDQ(j) of the electrical consumption current at rest IDDQ of the defective circuit, which is circulating in at least one of the supply terminals;

means for calculation which can determine whether this value measured IDDQ(j) is normal or abnormal, and can record the result of this determination; and means for calculation, which can make at least one comparison between at least one abnormal vector image and another pre-recorded image, known as the reference image, corresponding to the same portion of surface of the chip of the defective circuit or of the standard circuit as the abnormal vector image, these images being selected such that this comparison makes it possible to select an area, known as the defective area, of the surface of the chip on which there can be located an equipotential input line of the defective logic gate and/or an equipotential output line of the defective logic gate, and/or the defective logic gate.

Advantageously and according to the invention, the means for measurement of the value of the electrical consumption current at rest IDDQ of the circuit comprise an amplifier circuit which is fitted as a current/voltage converter. Advantageously and according to the invention, the amplifier circuit fitted as a current/voltage converter is designed to create a virtual memory, which is adjustable according to the constraints imposed by the supply of the circuit.

The invention thus makes it possible to reduce considerably the time necessary for location of a defective gate, by working only on the images which are useful, and in conditions which make it possible to facilitate the operations of comparison. It makes it possible to locate a defective gate which does not produce any functional fault, and to work on integrated circuits which are depassivated, or have not yet been passivated.

In fact, the invention makes it possible to locate the defective gate when there is available:
- the sequence of location vectors, which can be processed from a sequence of standard test vectors;
- a defective circuit, to detect and record the abnormal location vectors; and
- a defective circuit and/or a standard circuit, to acquire the images to be compared.

The invention makes it possible not only to locate the defective gate, but, owing to the certainty of this location, also to identify it by means of the production mask drawings (layout), if these drawings are available. It is then possible to characterise the fault physically, and to understand its origin with great reliability and very high accuracy. The method according to the invention can be automated, and executed mostly by computer, thus reducing human intervention to whatever is strictly necessary.

The invention also relates to a method and an installation, which are characterised in combination by all or some of the characteristics described previously or hereinafter.

BRIEF DESCRIPTION OF THE DRAWINGS

Other objects, characteristics and advantages of the invention will become more apparent from reading the following description, provided with reference to the attached figures, in which:

FIG. 6 is a diagram illustrating different known formats of test vector signals;

FIGS. 7a and 7b are two diagrams, illustrating respectively two variants for determination of the normal or abnormal character of the value measured of the electrical consumption current at rest IDDQ of a defective integrated circuit in a method according to the invention;

FIGS. 10a, 10b, 10c are diagrams illustrating steps of comparison of images of a method according to the invention, in the case of a defective gate which has a short-circuit fault which affects the electrical functioning at the output;

FIG. 14 is a diagram illustrating the division of images into rectangles, for a step of adaptive thresholding of a method according to the invention.

DESCRIPITON OF THE PREFERRED EMBODIMENTS

Figure 1:
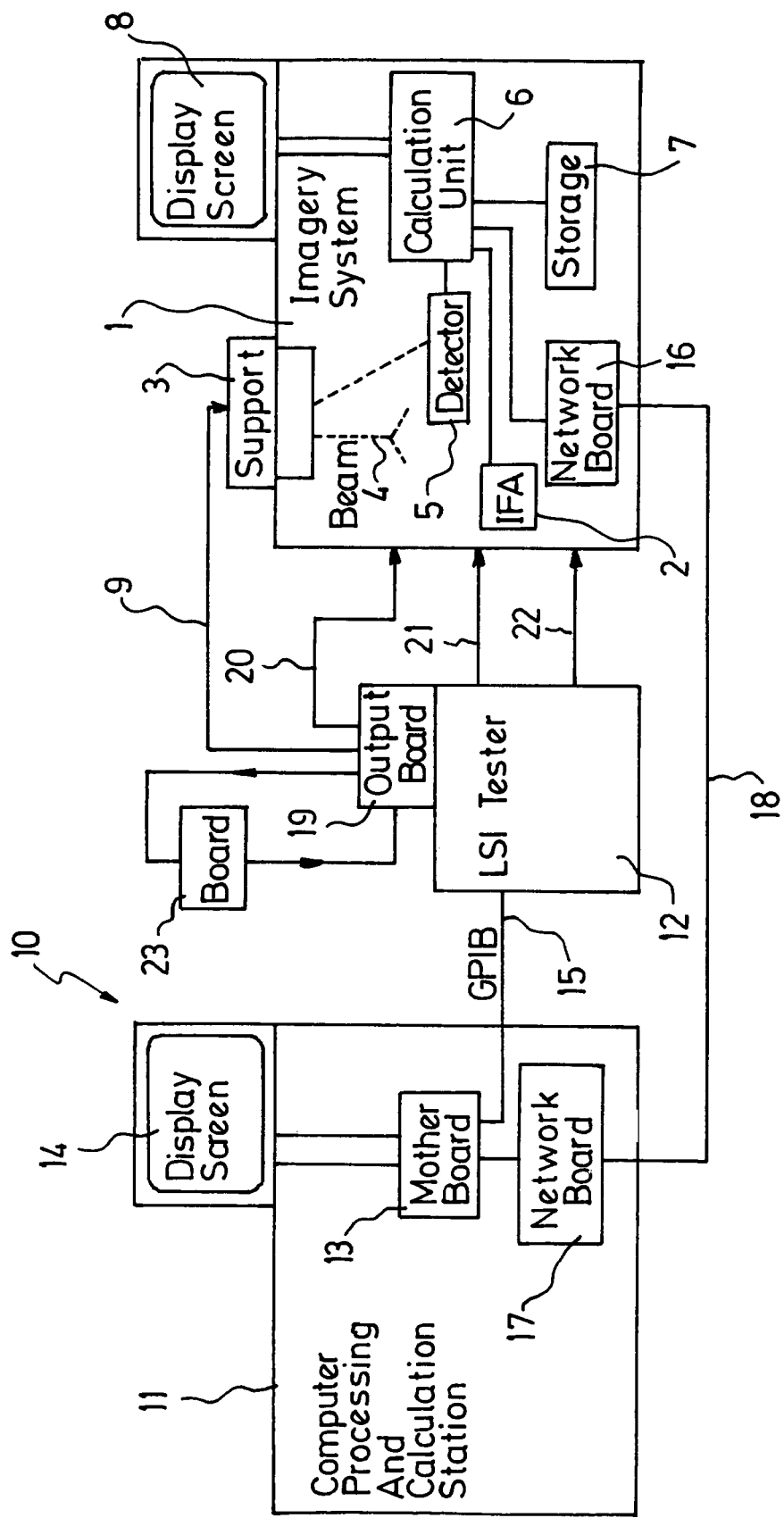
FIG. 1 is a schematic view of an installation according to the invention.

The installation represented in FIG. 1 comprises an imagery system 1 which uses electronic microscopy with contrast of potential, by detection of secondary electrons. A system of this type is in itself known, and is for example an IDS 5000 HX system, marketed by the company SCHLUMBERGER TECHNOLOGIES (FRANCE), provided with an IFA (Image Fault Analysis) board, in order to implement the technique known as CGFI, and with the API (Application Programming Interface) interface programming system IDSCMD, the assembly making it possible to control the microscope and to programme the acquisition of the images required of the surface of an integrated circuit with contrast of potential. The general characteristics of this system are well known, knowledge of them is implicit, and only the characteristics which concern the invention are described.

The images which are supplied by this imagery system 1 are monochrome pixelised images with contrast of potential, with a scale E of contrast levels, in general 256 contrast levels numbered from 0 to 255. The imagery system 1 comprises an integrated circuit support 3, which is provided with means for regulation of its transverse position X–Y relative to an electron beam 4 emitted by means for emission, in order to irradiate the surface of the integrated circuit, the images of which are to be produced.

The secondary electrons re-emitted are captured by a detector 5, which supplies the signal to a computer processing and calculation unit 6, which is provided with mass storage 7 which can permit recording of the images, and the various conventional peripherals of a computer work station (keyboard, mouse, etc), including a display screen 8.

The support 3 is designed to make it possible to place the integrated circuit in a chamber under vacuum, in which the electron beam 4 is emitted, whereas the input and output pins of the integrated circuit are connected electrically on the exterior of the chamber by a bundle of cables 9, to an integrated circuit test control system 10.

The test control system 10 is also in itself known, and is for example an HP 82000 system equipped with HP 82000 software, and with the TABULAR LINK extension marketed by the company HEWLETT PACKARD (FRANCE). The general characteristics of this system are well known, knowledge of them is implicit, and only the characteristics which concern the invention are described. This system comprises a computer processing and calculation station 11 and an electrical control unit, known as the LSI tester 12, which forms and controls the various signals to be applied to an integrated circuit to be analysed. The station 11 and the LSI tester 12 are connected to one another in a known manner by a GPIB control bus 15.

The station 11 comprises a microprocessor motherboard 13, an associated read/write memory and mass storage, and the various associated conventional peripherals (keyboard, mouse etc), including a display screen 14.

The station 11 of the test control system 10 is also connected to the unit 6 of the imagery system 1, by a computer network of the ETHERNET type, formed by a network board 16 which is associated with the unit, a network board 17 of the station 11, and a network cable 18, which connects the network boards 16, 17.

The LSI tester 12 comprises a connection board 19, from which there extend the various control and supply tracks of the integrated circuit, and which is connected by the bundle of cables 9 to the integrated circuit, which is placed in the imagery system 1.

In addition, the LSI tester 12 is connected to the IFA board 2 of the imagery system 1 by a cable 20, which connects a track IDS_SYNC of the output board 19, a cable 21 transmitting a triggering signal TRIGGER OUT of the control system 10, and a cable 22 transmitting a clock signal EXT_CLOCK of the control system 10, to the imagery system 1.

The LSI tester 12 also receives a board 23 for measurement of the electrical consumption current at rest IDDQ of the integrated circuit placed on the support 3. In the FIG. 1, this board 23 is shown on the exterior of the LSI tester 12, but it should be understood that this board 23 can be integrated in this LSI tester 12.

The output board 19 of the LSI tester 12 also comprises terminals VDD1, VDD2, VDD3, VDD4 for supply to the integrated circuit at a high potential VDD, and at least one terminal VSS for supply to the integrated circuit at a low potential VSS. Contrary to the normal connection, the supply terminal VSS of the connection board 19 is not connected directly to the ground 24 of the LSI tester 12, but is connected to the positive input of an operational amplifier 25 of the board 23 for measurement of the current IDDQ. The ground of the LSI tester 12, which is earthed, is connected to the other negative input of the operational amplifier 25. The operational amplifier 25 is for example an AD795, and is selected in order to accept a very low input current.

The measurement board IDDQ 23 comprises a circuit which is designed to create a virtual memory for the integrated circuit at the terminal VSS, the value of which can be adjusted according to the constraints imposed for the supply to the integrated circuit. This circuit is also designed to form a current/voltage converter, such that the signal supplied by the board 23 to the LSI tester 12 is a voltage signal which is compatible with this LSI tester 12.

In fact, an LSI tester 12 of this type is normally designed to receive voltage signals, and is not designed to measure currents. Between its negative terminal and its output, the operational amplifier 25 comprises a parallel resistor R and a parallel capacitor C. The resistor R makes it possible to adjust the current sensitivity of the measurement board 23, which is for example 0.1 $\mu$A for R=10 k$\Omega$, and 10 nA for R=100 k$\Omega$. The voltage sensitivity is 1 mV. The output of the operational amplifier 25 is connected to the positive input of a second operational amplifier 26, identical to the preceding one, which forms a second tracking stage, its negative input being connected to its output.

The output of this second operational amplifier 26 forms the output 27 of the measurement board 23, which is connected to one of the free tracks of the connection board 19 of the LSI tester 12, such that the measurement signal of the current IDDQ is supplied by the LSI tester 12 to the station 11, by means of the bus 15.

Figure 2:
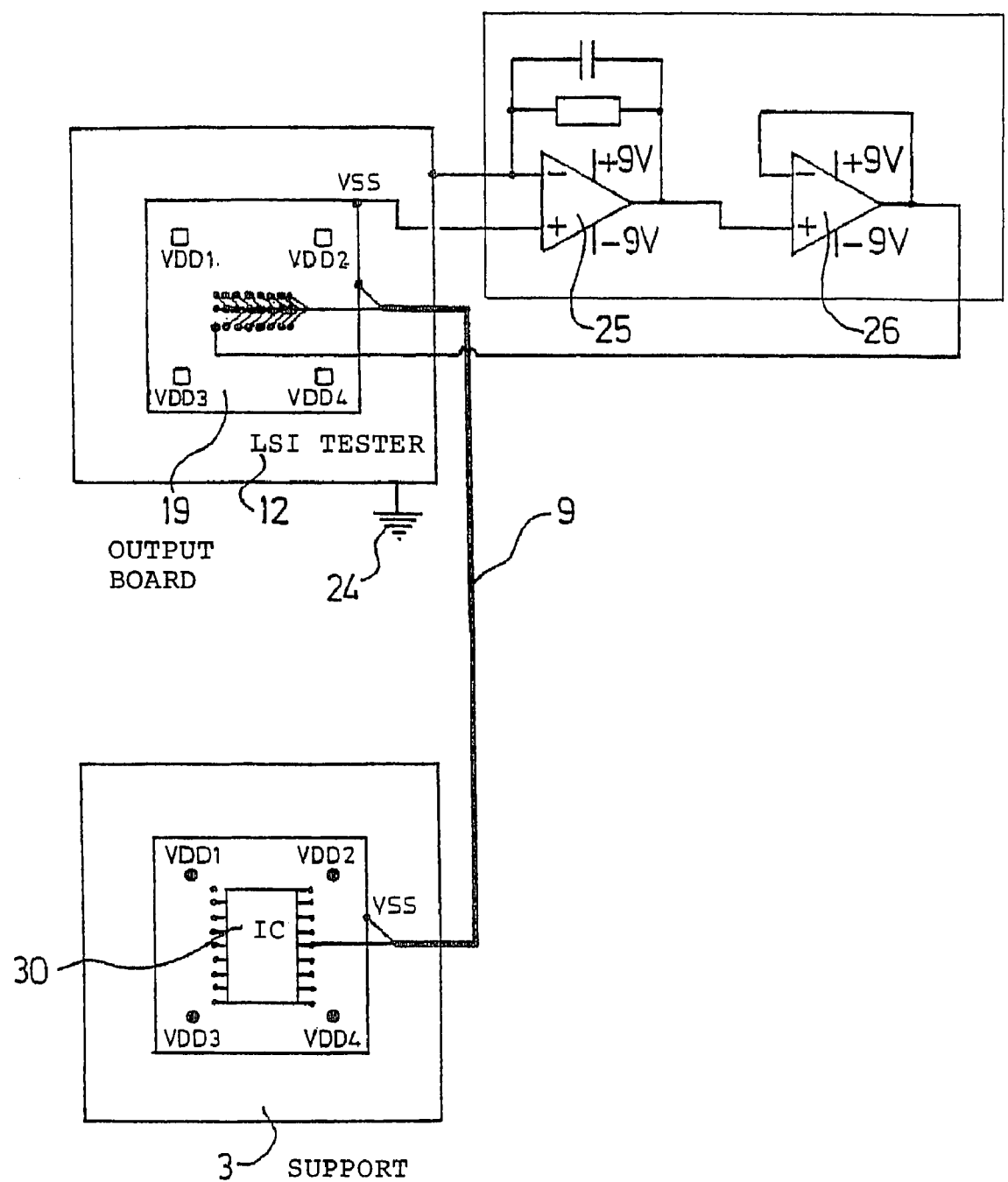
FIG. 2 is a schematic view illustrating the means for measurement of the value of the electrical consumption current at rest IDDQ of an installation according to the invention.

The measurement board 23 thus makes it possible to measure the current which is consumed by the integrated circuit, and is circulating between the supply terminal VSS of the integrated circuit and the ground 24 of the LSI tester 12. The integrated circuit, reference 30, FIG. 2, is placed on the support 3, and is connected, by means of the bundle of cables 9, at one at least of the supply terminals VDD1, VDD2, VDD3, VDD4, to a high potential, and at the supply terminal VSS, to the low potential VSS, corresponding to the ground of the support 3, which is isolated from the ground of the imagery system 1.

The station 11 is programmed (HP 82000 software) in order to permit control of the LSI tester 12, and transmission to the integrated circuit 30 which is connected to it, of a series of vectors, each vector being formed by a series of signals which are designed to be applied to the different input terminals of the integrated circuit 30.

Figure 3:
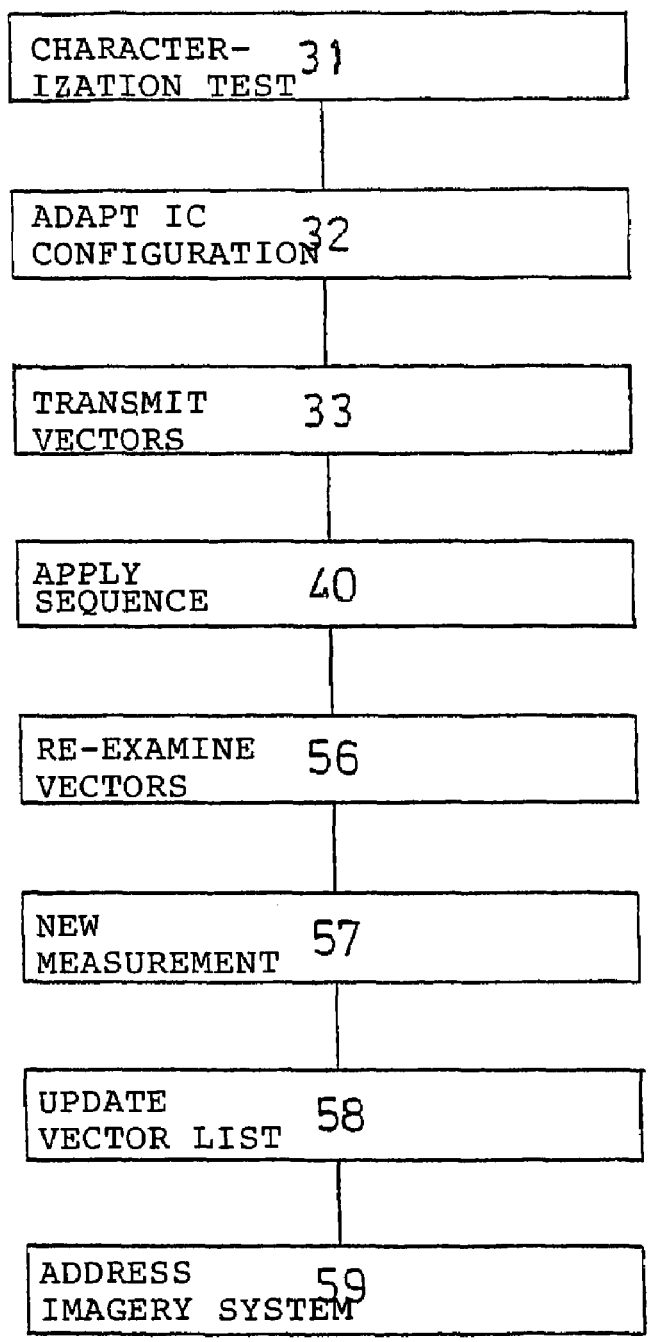
FIG. 3 is a flow chart of the steps of a method according to the invention, for the creation of the sequence of location vectors, measurement of the current IDDQ, and searching for, and recording, abnormal location vectors.

FIG. 3 represents the first steps of a method according to the invention, which is executed when there is a defective integrated circuit, on which it is being attempted to locate a defective logic gate. The defective integrated circuit 30 is placed on the support 3. During the step 31, a conventional electrical characterisation test is carried out on the integrated circuit 30, during which the current consumed by each of the input and output terminals is measured. These values are compared with the specifications supplied by the manufacturer, in order to verify that no fault is derived from outside the chip of the integrated circuit 30.

In the subsequent step 32, the electrical configuration of the LSI tester 12 of the integrated circuit 30 is adapted in a known manner, by connecting the various tracks of the connection board 19 to the appropriate input and output terminals of the circuit 30, and by acquiring the corresponding parameters at the station 11, and in particular the various formats of the pins of the integrated circuit 30.

During the subsequent step 33, a sequence of test vectors, which has previously been used to determine that the circuit 30 is defective, is transmitted to the station 11, and this sequence of test vectors is converted into a sequence of location vectors, with the format NRZ, which is appropriate for the fault location.

Figure 5:
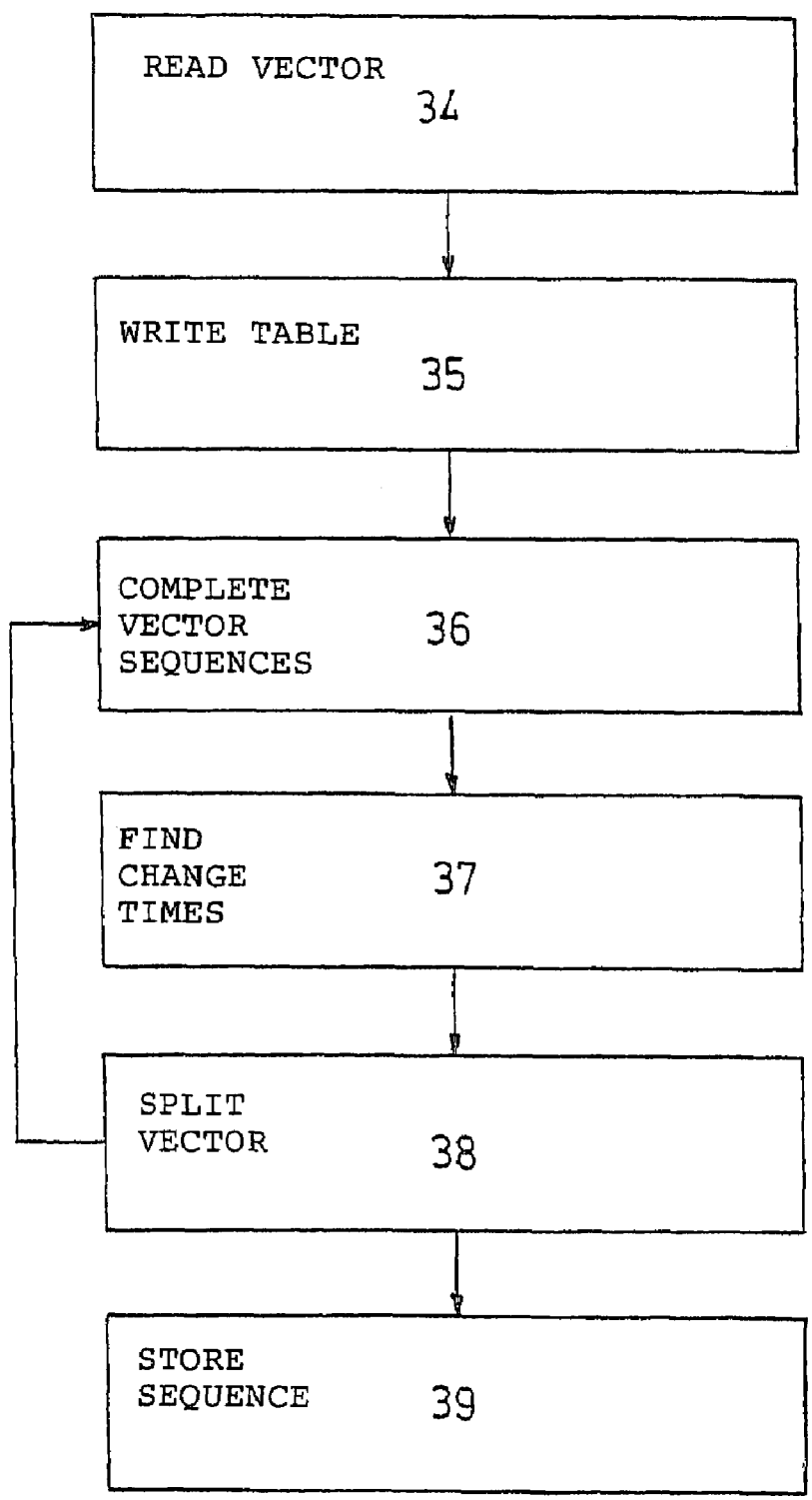
FIG. 5 is a flow chart illustrating a method which makes it possible to execute the conversion of a sequence of test vectors into a sequence of location vectors according to the invention.

The method carried out in step 33 is programmed at station 11, for example in HPVee programming language. It is schematised in FIG. 5.

In step 34, the formats used for each input pin in the test vectors are read. These formats can be NRZ, DNRZ, RZ, R1 or RC, as shown in FIG. 6, which, according to these formats, gives the example of changes of logic state for a vector signal which assumes in succession the values 0, 1 and 0.

In step 35, a table is written, which, in chronological order, represents the changes of logic state (front of start LE or front of end TE) of the various signals. An example of this table is as follows:

| TIME | LE | TE | NAME | FORMAT |
|------|----|----|------|--------|
| 10 | X |   | IN-X | R1 |
| 20 | X |   | CLOCK | RZ |
| 20 |   | X | VAL | DNRZ |
| 40 |   | X | CLOCK | RZ |
| 50 |   | X | IN-X | R1 |

Figure 4A:
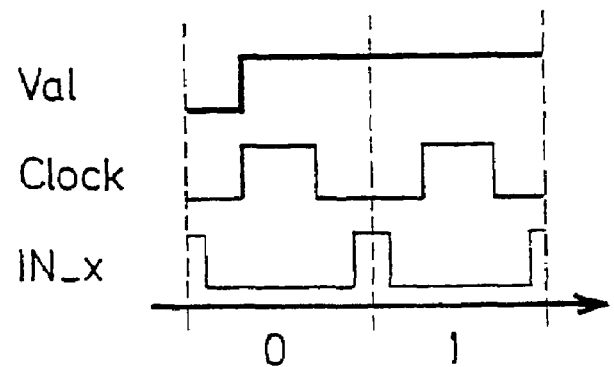
FIGS. 4a, 4b, 4c are an example of three diagrams, which, for three input signals VAL, CLOCK, IN-X, illustrate the conversion of a sequence of test vectors into a sequence of location vectors according to the invention.

This table 1 is that which is obtained with the signals VAL, CLOCK and IN-X of the test vectors in FIG. 4a. It makes it possible to determine the changes of logic state for each value of the signal of each test vector.

Figure 4B:
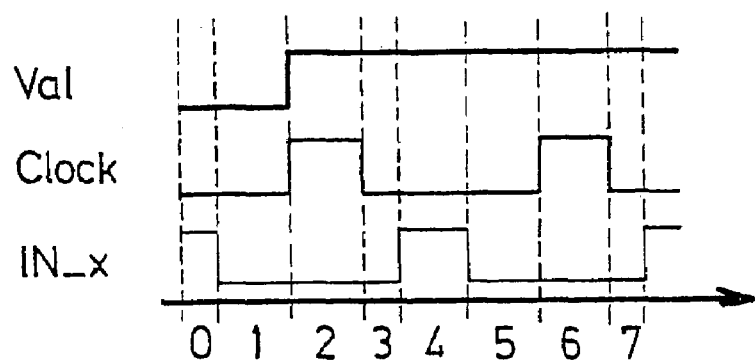

In step 36, the sequences of test vectors is completed progressively from the first test vector to the last, and, for each test vector, in step 37, according to the changes of value of the signals, the times are sought in the table, at which any changes of logic state take place in succession. As soon as a change of logic state (LE or TE) for at least one signal is found for this test vector, a split is created for the vector corresponding to this time. In other words, in step 38, the test vector is split into as many location vectors as there are changes of logic state made by this test vector, in relation to the logic state of the signals in the preceding test vector. Steps 36, 37 and 38 are repeated, so as to split all the test vectors into a sequence, which is stored in step 39, of location vectors, for which all the signals are in the NRZ format (without variation over a period of time, for each vector, of their value, which corresponds to their logic state). This therefore provides a sequence of location vectors as represented in FIG. 4b.

It should be noted that a sequence of location vectors of this type can also be created directly, for example by taking NRZ signals, rather than from a sequence of test vectors.

The advantage of starting with a sequence of test vectors which is transformed, is that there is certainty of reproducing the fault in the integrated circuit, the existence of which has previously been detected.

After this step 33 of conversion of the vectors has been carried out, in step 40 (FIG. 3), the sequence of location vectors is applied in step-by-step mode to the input terminals of the integrated circuit 30. For each location vector, the value of the current IDDQ of the defective integrated circuit 30 is measured. In this step 40, there is detection of the abnormal location vectors for which the value of the current IDDQ is abnormal, according to a method of comparison in relation to a pre-determined threshold value. If a nominal value IDDQnom of the current IDDQ of the defective circuit is known, this value is used as a threshold value, and it is considered that the value measured is abnormal when it exceeds this nominal value IDDQnom (FIG. 7a).

In another variant, it is determined whether the value measured IDDQ(j) is normal or abnormal, by calculating the standardised difference $$D=[IDDQ(j)-IDDQ^0(j)]/\text{maximum}[IDDQ^0(j), Imin]$$

in which

IDDQ(j) is the value measured of the electrical consumption current at rest IDDQ of the defective circuit with the test vector j;

$IDDQ^0(j)$ is the value measured of the electrical consumption current at rest IDDQ of a standard circuit; and Imin is a minimum current value which is pre-determined to eliminate the effects of noise, the value IDDQ(j) being considered as abnormal if D is greater than a pre-determined threshold value DS.

Figure 8:
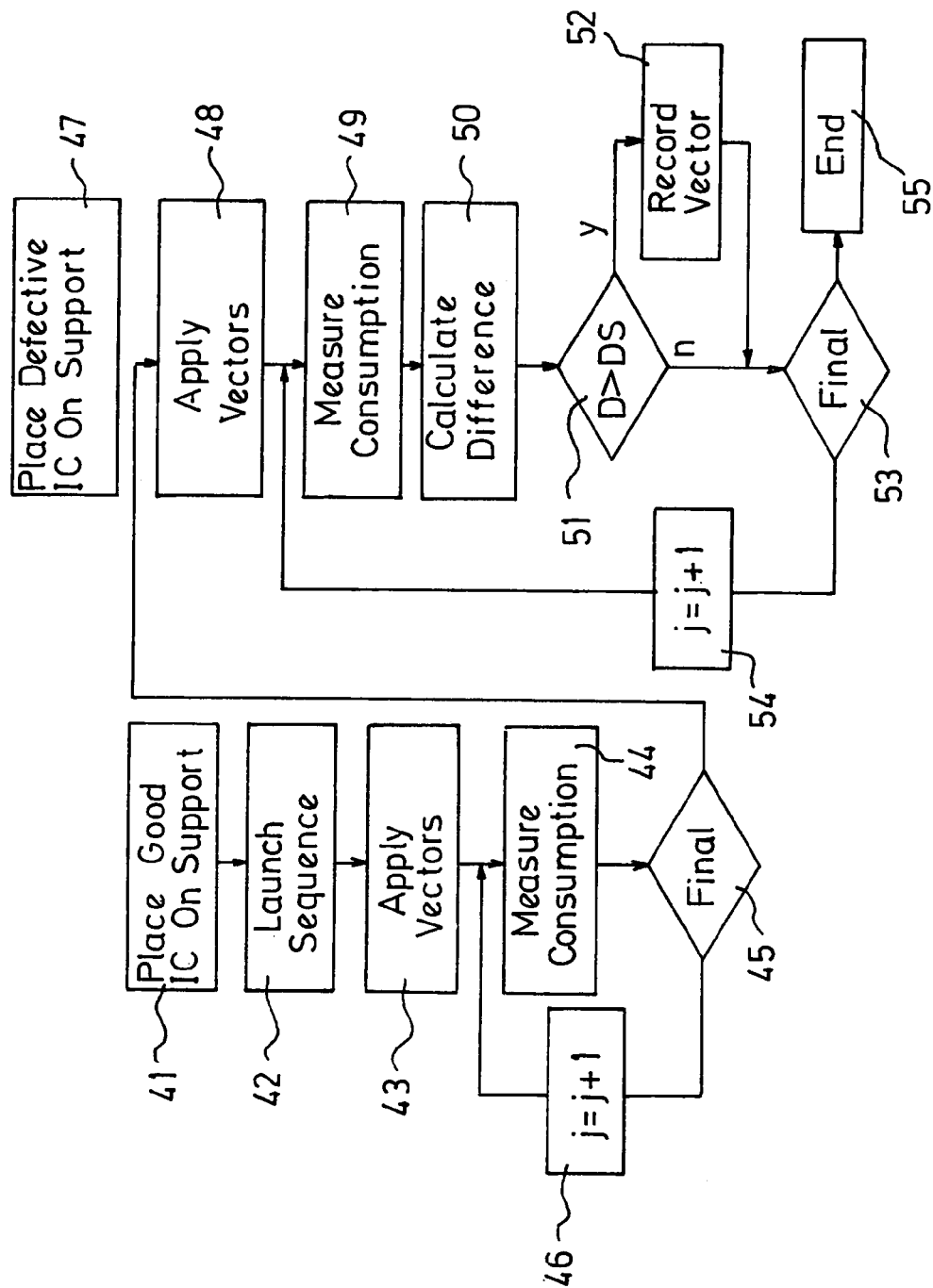
FIG. 8 is a flow chart illustrating a method for measurement of the current IDDQ, for determination of the normal or abnormal character of each location vector, and for creation and recording of the result of this determination.

FIG. 8 represents a flow chart of the method for comparison corresponding to this second variant.

In step 41, there is placed a standard integrated circuit, which is free from a defective gate and from any fault, and is identical to the defective circuit to be analysed on the support 3. In step 42, the sequence of location vectors is launched, and the first location vector is applied to the input terminals of this circuit in step 43, a variable j of counting of the vectors being initialised equal to 1. In step 44, the value of the electrical consumption current at rest IDDQ of the standard circuit is measured for the location vector j=1, then, in step 45, it is tested whether the value of the variable j is the final value or not. If this is not the case, this value j is incremented by one unit in step 46, in order to proceed to the subsequent location vectors.

In step 44, there is thus recording of the different values $IDDQ^0(j)$ of the current IDDQ for the different location vectors, and for the standard circuit.

When the final vector in the sequence of location vectors is reached, the defective integrated circuit is placed on the support 3, in step 47. The first location vector is applied to the input terminals of the circuit in step 48, and the variable j is re-initialised to 1. In step 49, measurement and recording is carried out of the value measured IDDQ(j) of the electrical consumption current at rest, then in step 50, the standardised difference D is calculated. In step 51, it is determined whether the difference D is greater than the threshold value DS or not. If this is the case, in step 52, it is recorded that the corresponding location vector is an abnormal location vector. Otherwise, there is progression to the test step 53, in which it is examined whether the location vector is the final one or not. If there is another location vector, the variable j is incremented by one unit in step 54, in order to reiterate steps 49 to 53, until the final vector in the sequence of location vectors is reached, after which the comparison process started in step 55 is ended.

The threshold value DS for the standardised difference is advantageously selected between 2 and 100, and in particular between 5 and 20, and for example is 10. The minimum current value Imin is advantageously selected as 10 nA with the tester HP 82000.

FIG. 7b represents an example of variation of the value measured IDDQ(j), and of determination of an abnormal location vector.

At the end of step 40 (FIG. 3), the list of abnormal location vectors is available.

Figure 4C:
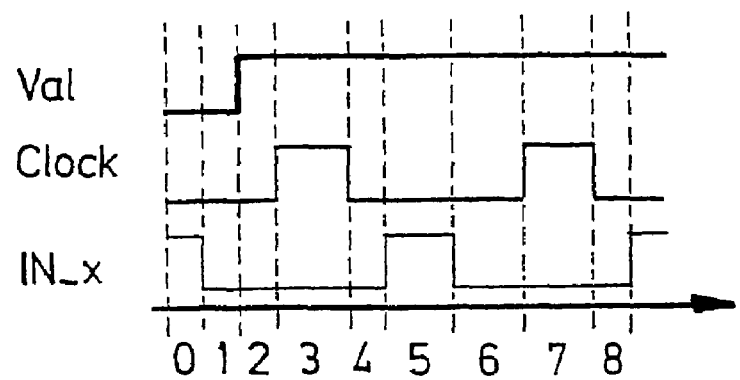

In the subsequent step 56, the abnormal location vectors are re-examined, in order to re-split them, such that two consecutive abnormal location vectors are distinguished from one another by the value of a single binary signal with the format NRZ, applied to a single input terminal of the circuit, as represented in FIG. 4c.

Thus, on completion of the above-described conversion step 33, the location vectors are in the format NRZ, as represented in FIG. 4b. Starting with the two test vectors in FIG. 4a, the conversion step 33 has made it possible to create seven location vectors, as represented in FIG. 4b. As can be seen in this figure, the signals VAL and CLOCK switch simultaneously between the vectors 1 and the vector 2. If the vector 1 is an abnormal vector, in step 56 temporal offsetting is then carried out of one of the two signals VAL or CLOCK, such as to create a new, intermediate location vector, in order to obtain the sequence represented in FIG. 4c.

Taking into account the very low number of abnormal location vectors which are detected in general, this re-splitting can be carried out manually. However, there is nothing to prevent programming of this re-splitting at the station 11.

In step 57, a new measurement is made of the current IDDQ, for each of the location vectors processed in the re-splitting step 56. It is then determined whether these location vectors are normal or abnormal, in the same manner as the above-described step 40.

In the subsequent step 58, the list of abnormal vectors is updated. In the subsequent step 59, the imagery system 1 is addressed, via the network 16, 17, 18, with the number of vectors in the location sequences, the list of abnormal location vectors, and the frequency of functioning of the integrated circuit. On the basis of these values, the imagery system 1 acquires the images necessary for the step of location of the defective gate.

The imagery system 1 and its IFA board, makes it possible to acquire images according to the method known as CGFI. Whilst a location vector is applied to the input terminals of the defective circuit or of a standard circuit placed on the support 3, the system 1 makes it possible to produce and record a set of images, known as vector images, which represent equipotential lines formed by the tracks of the logic gates of the said circuit, each equipotential line corresponding to one of the differentiated states of potential on the vector images. The different, rectangular vector images of a single set of images are designed to cover and represent the entire surface of the chip, or an entire portion of this surface, on which it is being attempted to locate the defective logic gate.

The signal IDS_SYNC which is addressed by the tester LSI 12 to the system 1 makes it possible to synchronise the acquisition of the images in relation to the development of the location vectors applied by the tester LSI 12 to the integrated circuit.

Unlike in the prior art, the imagery system 1 is not programmed to acquire all the images of the surface of the chip for all the location vectors, but to acquire only particular sets of images which correspond to particular location vectors, which are pre-defined, as described hereinafter. On the basis of these particular vector images, the imagery system 1 is programmed to execute a step of location of the defective gate, in which it makes at least one comparison between at least one vector image, known as the abnormal vector image, which was acquired when an abnormal location vector was being applied to the integrated circuit, and another pre-recorded image, known as the reference image, which is selected such that this comparison makes it possible to select an area, known as the area of defectiveness, on the surface of the chip, on which there may be located an equipotential input line of the defective logic gate, and/or an equipotential output line of the defective logic gate, and/or the defective logic gate itself.

The imagery system 1 is programmed by means of application programming interface (API) commands IDSCMD, which constitute a programming system which makes it possible to write command scripts in order to acquire the required images on the areas of the surface of the pre-selected chip.

The APIs used for configuration of the test command system 10 (HP82000) and of the imagery system 1 (IDS 5000 HX) for the purpose of synchronous acquisition of the images (in particular with determination of the duration of application of the vector, known as HOLD, and the duration of acquisition of the images), can be as follows:
    idscmd ids_sem_oi_set MC_DelayON
    idscmd ids_sem_oi_set IfaSetupSyncNeg
    idscmd ids_sem_oi_set hwGateWidth
    idscmd ids_sem_oi_set HoldTime
    idscmd ids_sem_oi_set hwDelay
    idscmd ids_sem_oi_set MC_sem_imagetest
    idscmd ids_sem_oi_set SetupTesterInteractAuto
    idscmd ids_sem_oi_set IfaSetupSyncEnable
    idscmd ids_sem_oi_set hp
    idscmd ids_sem_oi_set ethernet
    idscmd ids_sem_oi_set hwGateWidth
    idscmd ids_sem_oi_set HoldTime
    idscmd ids_sem_oi_set hwDelay The API which permits activation of the IFA board for acquisition of an image is as follows:
    idscmd ids_sem_oi_set MC_image_test.

The API which is used in order to control the displacement of the electron beam, and acquisition of a set of images, can be as follows:
    ids_sem_get_expected_position
    ids_sem_get_current_position
    ids_sem_set_position x y
    ids_sem_get_micron_per_pixel.

The APIs used for handling the images can be as follows:
    ids_sem_load_image filename
    ids_sem_store_image filename.

Figure 9:
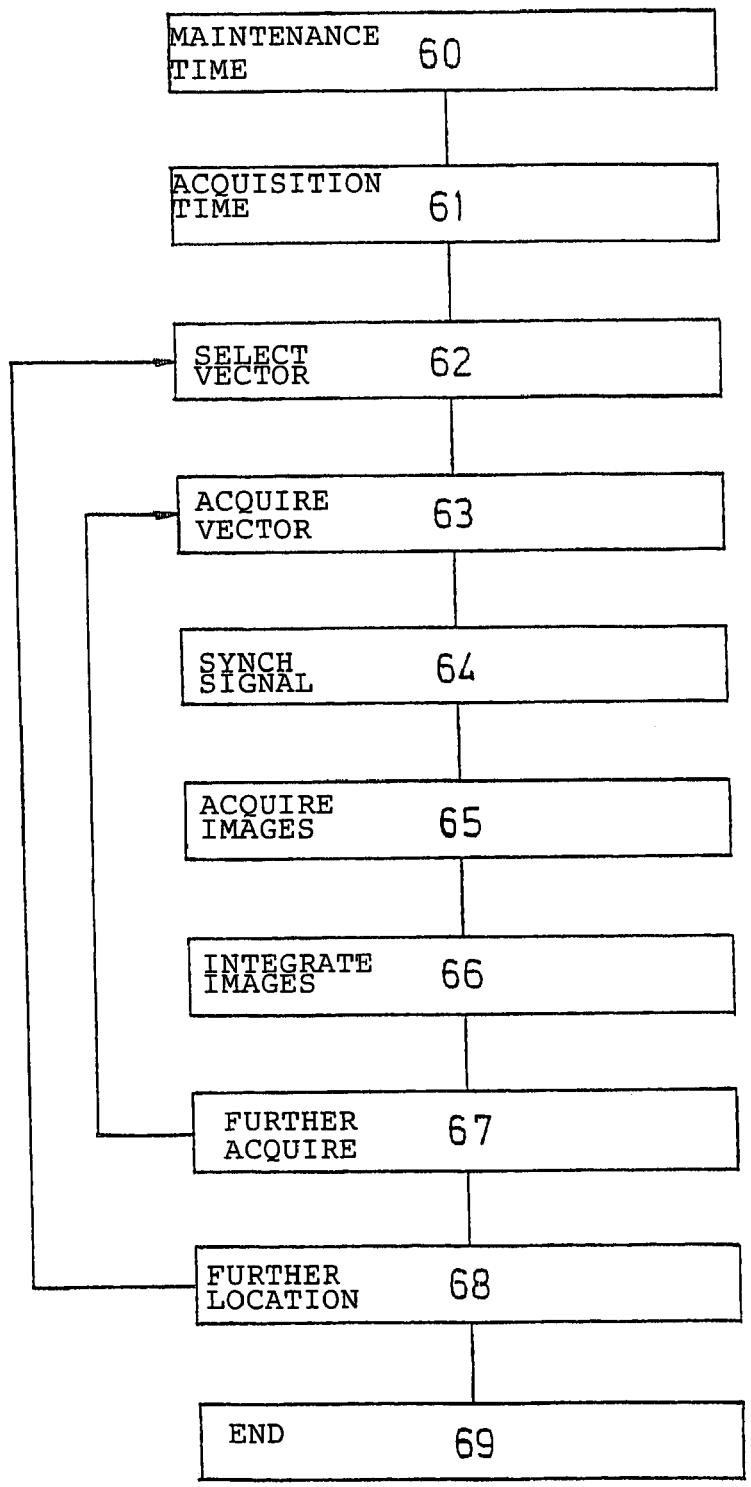
FIG. 9 is a flow chart illustrating the steps of a method according to the invention, for acquisition of the vector images.

FIG. 9 represents a flow chart of the method implemented for acquisition of the images for each location vector pre-determined.

In step 60, the imagery system 1 calculates the maintenance time for each location vector (HOLD) necessary in order to acquire the images corresponding to this vector. This value is supplied to the control system 11 by the network 16, 17, 18. It is calculated in particular according to the frequency of functioning of the circuit, which the imagery system 1 has previously received from the control system 11.

In step 61, the imagery system 1 calculates the total duration of acquisition of the different images (taking into account in particular the number of images to be acquired for each set of images, and the number of location vectors concerned). This duration is used in order to keep the imagery system 1 active during a period which is sufficiently long to acquire all the images required.

In step 62, the imagery system 1 selects the first location vector for which a set of images must be produced. In step 63, it then prepares acquisition of a first image vector of the set of images, by displacing the electron beam opposite the corresponding area of the surface of the chip of the circuit 30 placed on the support 3.

In step 64, the imagery system 1 sends a signal via the network 16, 17, 18 to the control system 11, such that the latter controls the tester, and places the synchronisation signal IDS_SYNC throughout the duration of the vector to be acquired.

In step 65, the imagery system 1 acquires n times the corresponding image, whereas the location vector is applied to the integrated circuit 30. For example, n=16 is selected, such that each image is acquired 16 times in succession.

In step 66, the imagery system 1 carries out integration of the n identical images, by allocating to each pixel the average value obtained on the n images for this pixel. Median filtering is then carried out by allocating to each pixel the median value of all the pixels formed by this pixel and the pixels which surround it, such as to eliminate peaks caused by the noise, and to supply a single monochrome, pixelised, averaged image of the portion of surface of the chip.

The integration of the images makes it possible to reduce the ergodic and stationary noise. The median filtering makes it possible to eliminate the noise peaks, without affecting the dynamics or the contrast of the images. These operations are carried out numerically, pixel by pixel.

In this step 66, the image thus obtained is recorded.

In the subsequent step 67, it is examined whether it is necessary to acquire other images in the set of images for the same location vector. If this is the case, there is a return to step 63, in order to displace the electron beam opposite the portion of surface of the chip which corresponds to acquisition of another image, then steps 64, 65 and 66 are carried out, making it possible to acquire and store the corresponding image. All the images have the same rectangular, generally square format.

If this is not the case, in step 68, it is subsequently examined whether another set of images must be produced for another location vector. If this is the case, there is return to step 62, in which the imagery system sends a request to the control system 11, in order to apply another location vector. For this location vector, there is then execution of all the steps 63 to 67, making it possible to acquire the different vector images of the set of images. If this is not the case, i.e. if there is no further location vector for which the images must be acquired, the image acquisition process is interrupted, and the step of location of the defective gate is carried out, on the basis of the different images acquired and recorded.

In each comparison step, there is comparison of two images of a single portion of the surface of the chip, known as initial images, and another image is formed, known as the result image, on the basis of automatic processing carried out by the imagery system 1 on the two initial images.

Several types of processing can be applied to the initial images, in order to form a result image. In a first type of processing, known as difference processing, a result image is formed, representing the equipotential lines which have the same forms, and states of potential which are different, and in particular opposite, between the two initial images. For this purpose, a difference in the two initial images is produced, pixel by pixel, according to the formula:

$$PC=(PA-PB)/2+INT(E/2)$$

in which PA is the value of the contrast level of the pixel of the first input image; PB is the value of the contrast level of the pixel of the second input image; E is the maximum value of the contrast level of the images; PC is the value of the pixel of the image formed; and INT is the whole part function.

This difference processing is applied to two initial images acquired on the same circuit, i.e. either on the defective circuit or on a standard circuit. This difference processing reveals the differences between two distinct electrical states corresponding to two distinct location vectors, divides the image noise into two, reduces the effect of the topography, and, by masking the states which are common to the two initial images (the pixels of similar contrast levels of the initial images appear grey in the image formed), decreases the quantity of information to be processed subsequently.

In a second type of processing, a result image is formed, representing the equipotential lines which are common to the two initial images. This processing, which is known as extended AND+ intersection, consists of forming the result image, by allocating the following contrast levels to each of its pixels:

black if the two pixels of the initial images are black;
white if the two pixels of the initial images are white; and
grey in all other cases.

In a third type of processing, the result image represents the equipotential lines of one or the other of the two initial images, with the exclusion of the equipotential lines which are common to these two initial images. This processing is known as extended exclusive OR, i.e. XOR+. In order to carry out this processing, each pixel of the result image is formed by allocating to it the following contrast level:

grey if the two pixels of the initial images have the same contrast level;
white if one of the two pixels of the initial images is white, and the other is grey; or if one is white and the other is black; or if one is grey and the other is black; and
black if one of the two pixels of the initial images is black, and the other is grey; or if one is black and the other is white; or if one is grey and the other is white. It should be noted that the order in which the two initial images is examined is important in this XOR+ processing.

In addition, advantageously and according to the invention, adaptive thresholding processing is carried out at three contrast levels, i.e. white, black and grey, of the initial images. An adaptive thresholding step of this type is advantageously provided prior to a comparison by extended intersection and/or by extended exclusive OR, such as to prevent any error of allocation of the contrast levels during these processing operations. On the other hand, the difference processing can be carried out on initial images which have not previously undergone adaptive thresholding.

The step of adaptive thresholding of an image is carried out as described hereinafter.

The image is a pixelised image (of the BITMAP type), comprising b columns of pixels and c lines of pixels. In this image, it is attempted to distinguish at the most three contrast levels, corresponding to the normal logic states of potentials, i.e. black (0), grey (INT(E/2)) and white (E).

In the image formed by the imagery system 1, it is not possible to distinguish the three contrast levels, white, black and grey correctly, since their real contrast levels which may correspond to these values normally overlap. Thus, the maximum value which normally corresponds to the black may be greater than the minimum value of the real contrast level which normally corresponds to the grey, and the maximum value of the real contrast level which normally corresponds to the grey may be greater than the minimum value of the real contrast level which normally corresponds to the white.

On the initial images, rectangles are defined with a length d and a width e, starting with the lower left edge of the image, as represented in FIG. 14. If each of these rectangles is designated as Rik, in which i represents the number of the rectangles in lines, and k represents the number of the rectangles in columns, the first rectangle is the rectangle R11, situated in the lower left-hand corner of the image. The following rectangle is the rectangle R12, which can be seen to overlap the rectangle R11 over half its width. Similarly, the rectangle R21, which is above the rectangle R11, overlaps the latter over half its height. Thus, and according to the invention, the different rectangles overlap one another along half their height and half their width.

Figure 13:
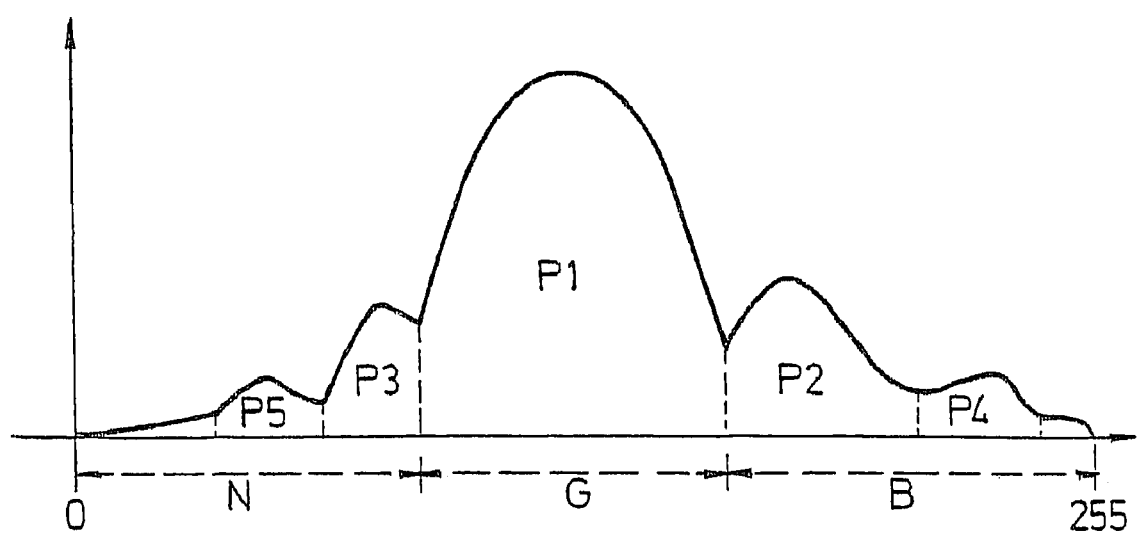
FIG. 13 is an example of a histogram of an image of a portion of surface of circuit obtained by electronic microscopy with contrast of potential, which has undergone processing consisting of integration and median filtering.

In each rectangle, it is determined whether there is one contrast level, two contrast levels, or three contrast levels, and there is allocation to each pixel of the objects identified in the rectangle, of only one of the different contrast levels, black, grey and white. For this purpose, the histogram of the contrast levels of each rectangle is used (FIG. 13). The histogram is the curve, which on the x-axis represents the contrast levels from 0 to E=255, and on the y-axis represents the numbers of pixels for each contrast level. This histogram has a minimum contrast level NGmin, a maximum contrast level NGmax, an average contrast level NGmoy, and a standard deviation ETNG of the contrast levels.

The number of contrast levels of the rectangle is first of all determined. Firstly, a minimum size for each object is determined, corresponding to a rectangle with fxg pixels, in which $f \leq g$; $f \geq e/10$; and $g \geq d/10$. On the basis of the knowledge of the size of the tracks of the integrated circuit, these conditions make it possible to determine the appropriate values d and e.

It is also known that, in the complete image of a portion of surface of a chip of an integrated circuit, the grey which corresponds to the background of the image is in the majority. It is determined that the three contrast levels are present in a rectangle if the histogram of the rectangle has at least three distinct main peaks (maximum points), and if at least one of the following two conditions applies:

1) $NGmoy \geq S1$ and $(NGmax-NGmin)/NGmoy \geq S2$
2) $NGmax-NGmin \geq S3$ and $ETNG \geq S4$.

If the aforementioned two conditions do not exist, it is determined that there are two contrast levels in the rectangle, when the following different conditions exist:

1) there are at least two distinct main peaks in the histogram of the rectangle;
2) $NGmax-NGmin \geq S5$;
3) $ETNG \geq S6$.

The threshold values S1, S2, S3, S4, S5 and S6 are pre-determined experimentally from known images of a well-known integrated circuit of the same type.

If none of the preceding conditions exists, it is considered that there is only a single contrast level in the rectangle.

On the basis of the histogram of the rectangle Rik, an example of which is represented in FIG. 13 (after integration and median filtering have taken place), the different peaks are separated by vertical lines, on the basis of the minimum levels. The surface area of each of the peaks is then calculated, and is classified by order of size, and there is selection of the three largest peaks, which are used in order to delimit the three contrast levels. As can be seen in FIG. 13, the largest peak is the central peak P1, the second largest peak is the peak P2, which is situated immediately to the right of the peak P1, the third largest peak is the peak P3, which is situated immediately to the left of the peak P1, and the peaks P4 and P5 are smaller. The lines of separation of the peaks P1 ad P2, and P1 and P3, are therefore frontiers between the contrast levels black N, grey G and white B, as represented in FIG. 13. It should be noted that all of this processing is carried out automatically by calculation, on the basis of the histogram of the rectangle Rik.

If the rectangle contains the three contrast levels, there is allocation to each pixel of the contrast level black, white or grey, corresponding to the above-described splitting of the histogram. Preferably, the contrast level black corresponds to the value 0, with the contrast level white corresponding to the value E (for example 255), and the contrast level grey corresponds to the value INT(E/2) (for example 127). It should be noted that other values could be selected, i.e. a low value (which is or is not equivalent to 0), a high value (which is or is not equivalent to E), and a median value, such as to define three distinct balanced contrast levels.

If the rectangle Rik contains one or two contrast levels, the objects of common contrast levels of the adjacent rectangles are used to allocate the correct contrast levels to the pixels of this rectangle. In fact, the rectangles overlap, and each pixel of the median part of the image belongs to several different rectangles (up to four rectangles if the frontiers are excluded, and up to nine rectangles if the frontiers are included). If a rectangle has one or two contrast levels, the other rectangles which constitute this pixel are examined, in order to determine its contrast level.

If no rectangle in the image contains the three contrast levels, the latter are allocated as follows: if there is only one contrast level, grey is selected; if there are two contrast levels, the one which is encountered most frequently (number of pixels) is allocated to grey, and the other is black if the value of the pixels is lower, or white if the value of the pixels is higher. If necessary, human intervention can be accepted in order to allocate the contrast levels in rare complex cases, in which it is not possible to allocate these contrast levels by fully automatic step-by-step calculation.

After these contrast levels have been allocated, median filtering is carried out, to make it possible to eliminate the noise. There is then re-assembly of the different rectangles, in which each pixel has received one of the three contrast levels, in order to re-constitute the image.

On completion of this step of adaptive thresholding, the image obtained comprises only three contrast levels, i.e. black (0), grey (127) and white (255).

In addition, after each processing step of the extended intersection type AND+ or extended exclusive OR type, XOR+, or of adaptive thresholding, a step is carried out, known as the reduction step, in which there is carried out median filtering, then erosion and expansion of the black or white pixels. This processing, consisting of erosion or expansion of pixels, which makes it possible to eliminate non-significant projecting or recessed pixels, is in itself known. With processing of this type, an isolated pixel is eliminated, a pixel which projects in relation to a block with the same contrast level is eliminated, and a pixel which is recessed in a block of different contrast levels is restored to the contrast level of the block. The groups of pixels are thus re-formed into polygonal blocks.

Figure 10C:
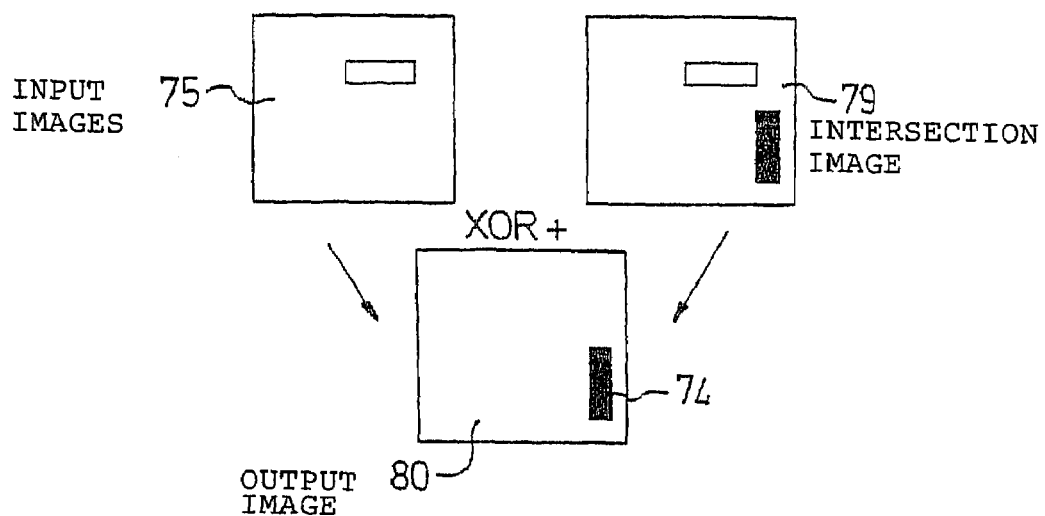

FIGS. 10a, 10b, 10c illustrate the different steps of comparison of images, in the case of a defective logic gate with a short-circuit fault which affects the electrical functioning at the output of the integrated circuit. In a first comparison step, represented in FIG. 10a, two images of the same area of the defective integrated circuit are used, i.e. an abnormal vector image, known as the fault abnormal vector image 70, and a vector image, known as the fault reference image 71, which is obtained with the defective circuit for a normal location vector, for which the current value IDDQ is normal. On the basis of these two images 70, 71, an image is formed, known as the simple fault image, representing the equipotential lines of the defective circuit, which have the same forms and location, and opposite, different states of potential, such as to be representative of the equipotential line at the input of the defective logic gate. This simple fault input image is obtained by means of the difference in the fault abnormal vector image 70 and the fault reference image 71.

In order to form the fault reference image, use is made of the normal location vector, which is for example any vector which precedes the first abnormal location vector in the sequence of location vectors. In fact, it is known that all the location vectors which precede the first abnormal location vector, are normal. It should be noted in this respect that in almost all cases, the defective circuit contains only a single defective logic gate.

In addition, a plurality of simple fault input images is formed, such as the image 72, on the basis of a single fault abnormal vector image 70, which is compared with a plurality of fault reference images, such as the image 71. In FIG. 10a, there is thus represented a second simple fault input image 72', which is obtained by difference, from the simple fault input image 70 and another fault reference image. All the simple fault input images have in common the equipotential input line 73 of the defective logic gate of the circuit. In fact, it is certain that between an abnormal vector image and a normal vector image, the equipotential input line of the defective gate has changed its state of potential, and thus its contrast level. On the other hand, when the fault corresponds to a short circuit, the output of the defective logic gate is not modified.

It should be noted that the fault abnormal vector image 70 and fault reference image 71 are images obtained from electronic microscopy, which have undergone processing consisting of integration and median filtering only. Thus, FIGS. 10a to 12b represent simplified images, but it should be understood in practice that this is simply a schematic representation, and that in reality, the images are far more complex.

Adaptive thresholding processing is then carried out on the different simple fault input images 72, 72', etc, obtained, as previously stated, then processing consisting of reduction of each of these images is carried out.

The simple fault input images 72, 72' are then compared in pairs and in cascade, forming ultimately an image, known as the intersection fault input image 75, representing the equipotential lines which are common amongst the different simple fault input images. This intersection fault input image 75 represents the equipotential input line 73 of the defective logic gate, and, in general, only this equipotential line. In fact, it is sufficient to select a sufficient number of simple fault input images 72, 72', etc, in order to obtain this single equipotential line 73 on the image 75. In order to form the intersection fault input image 75, an extended AND+ intersection is produced between the different simple fault input images 72, 72', etc, as previously described.

In addition, in order to find the fault equipotential output line, at least one comparison is made between two images of a standard circuit, as represented in FIG. 10b. An abnormal vector image is used, known as the standard abnormal vector image 76, obtained by applying an abnormal location vector to the standard circuit (placed in the support 3). As the reference image, an image known as the standard reference image 77 is used, which is obtained by applying a normal location vector to the standard circuit. The difference between these two images is determined, in order to obtain the image 78, on which it is known that the input 73 and output 74 equipotential lines of the defective gate are represented. This image, known as the simple standard input/output image 78, represents the equipotential lines of the standard circuit which have the same form and the same location, and states of potential which differ between the standard abnormal vector image 76 and the standard reference image 77.

As in the previous case, a plurality of simple standard input/output images 78, 78', etc, is formed from the same standard abnormal vector image 76, which is compared, by difference, with a plurality of standard reference images such as the standard reference image 77. Then, by comparing in pairs and in cascade the different simple standard input/output images 78, 78', another image known as the intersection standard input/output image 79 is produced, representing the equipotential lines which are common amongst the different simple standard input/output images 78, 78', i.e. the equipotential input line 73 and the equipotential output line 74 of the defective logic gate. In order to form this intersection standard input/output image 79, the extended AND+ intersection is produced of the different simple standard input/output images 78, 78', as previously stated.

As represented in FIG. 10c, it is possible to make a further comparison, in which an image is formed, known as the output image 80, representing only the equipotential output line of the defective logic gate, and its propagation in the defective circuit. For this purpose, an EXTENDED EXCLUSIVE OR, XOR+, is produced from the intersection fault input images 75 and the intersection input/output image 79.

It should be noted that, in order to form the intersection input/output image, adaptive and reduction thresholding processing is previously carried out on the simple input/output images 78, 78'. Also, before carrying out the extended exclusive OR of the intersection fault input images 75 and intersection input/output images 79, reduction processing of these images is carried out. As a result of the different processing operations which have been carried out previously, it is then possible, without risk of error, to compare the two images 75, 79, even though they have not been produced with the same integrated circuit. On the other hand, it should be noted that the complex images which are obtained from the imagery are compared with one another (by difference) only when they are obtained from a single circuit, i.e. either the defective circuit or a standard circuit.

The output image 80 is also subjected to reduction processing.

The invention thus makes it possible, simply and in a fully automated manner, to form images 75, 80, which are representative of the input line 73 only, and of the output line 74 only, of the defective logic gate. On the basis of these images 75, 80, it is possible to locate accurately the defective logic gate, in an automatic manner.

It is known that the distance between the output and the input of the defective logic gate is short, and that it is from the output of the defective logic gate that it is advantageous to run equipotential lines. In fact, the defectiveness of a logic gate is in general the result of a physical fault located on the equipotential output line.

The images 75, 80 are split into rectangles, as previously described for the adaptive thresholding processing, with the exception of the fact that the different rectangles do not overlap one another, but are juxtaposed edge by edge.

The angles are sought in which the output image 80 and the intersection fault input image 75 both comprise at least one object, the normal contrast level of which is either white or black (presence of white or black pixels).

For this purpose, an extended exclusive OR, XOR+, is produced between the rectangle of the intersection fault input image 75, and an entirely grey rectangle with the same dimensions, then the image obtained of the rectangle is subjected to reduction processing. If this image is not entirely grey, i.e. if it contains black and/or white pixels, the same processing is carried out on the basis of the same output image rectangle 80, by producing the extended exclusive OR, XOR+, of the rectangle of the output image, with an entirely grey rectangle with the same dimensions. The image obtained is subjected to reduction processing. If this image is not entirely grey either, a further extended exclusive OR, XOR+, is produced, from amongst the images previously obtained, in order to obtain a final image. The final image is subjected to reduction processing. This final image represents an area in which the fault corresponding to the defective logic gate is located.

If, by carrying out this processing, a plurality of dissociated areas of the image is obtained, in which the fault of the defective logic gate may be located, it is possible to repeat the process by using a smaller dimension for the rectangles. If, on the other hand, no area is found in which the fault may be located, the process is repeated with a rectangle which has larger dimensions, of length and/or width. It is possible to begin with rectangles with the same dimensions (d and e) and those used for adaptive thresholding processing, as previously described. Finally, with this process, it is possible to obtain a single precise area, in which the defective logic gate is located.

Once again, it should be noted that all of these operations can be carried out entirely by computer programming, by numerical calculation and processing of information. The only elements of intervention by the user consist of determining the different values of statistical threshold used for the adaptive thresholding, according to the type of integrated circuit examined. These values are determined experimentally. For example, for CMOS integrated circuits with $0.7\mu$ to $1.5\mu$ technology, with two levels of metal and a polished level, and with the above-described imagery system 1, the following threshold values are used: S1=100, S2=1.3, S3=160, S4=47, S5=130, S6=20. In order to determine these threshold values, it is possible to use known images of integrated circuits, the levels of potential of which are known, of which the levels of minimum, maximum and average contrast and the standard deviation are calculated.

It should also be noted that this adaptive thresholding operation which can be automated then makes it possible to make comparisons of images numerically, using logic operators of the AND+ and XOR+ type (and not using operators of the arithmetic type), thus making these operations much faster and simpler.

It should also be noted that use of splitting of the images into rectangles which do or do not overlap in the different processing operations (rectangles which overlap for the adaptive thresholding, rectangles which are adjacent for the search for the defective gate) makes it possible to accelerate the speed of processing considerably, since it is not necessary to carry out a calculation for each pixel. Each rectangle can conventionally have a dimension of 10 to 100 pixels in width and in height, and thus incorporate between 100 and 10000 pixels.

In addition, according to the invention, after having made a first step of comparison, in which one or a plurality of defective areas of the surface of the chip have been selected, it is not necessary to make further comparisons on all the images of the sets of images. In fact, it is possible to make further comparisons simply on the basis of vector images which correspond to the said defective area(s) thus preselected. For example, the AND+ operation carried out on simple fault input images 72, 72' can be executed only on images which have given a result on completion of the differentiation of the initial images 70, 71. In fact, it should be remembered that for its representation, the surface of the chip of the circuit requires a set of several images, and conventionally 512 adjacent images. The first comparisons must be made on the 512 images which correspond to the location vectors selected, but the further comparisons are made only on some of the images in the set of images, which correspond to the area of defectiveness previously selected.

Advantageously, in the first comparison of the step of location of the fault, a vector image is used which is obtained with the first abnormal location vector, which appears first in the sequence of location vectors. Thus, it is highly probable that the area of defectiveness selected will have limited dimensions.

Consequently, the method according to the invention is very quickly convergent, and it has been found in practice that the defective logic gates can be located from a small number of initial images. In general, two steps of differentiation of images of the defective circuit 70, 71, and two steps of differentiation of images of the standard circuit 76, 77 are sufficient. It is therefore necessary to acquire and compare only two sets of images of the defective circuit, then two sets of images of the standard circuit corresponding to the areas of defectiveness selected with the defective circuit.

Figure 11A:
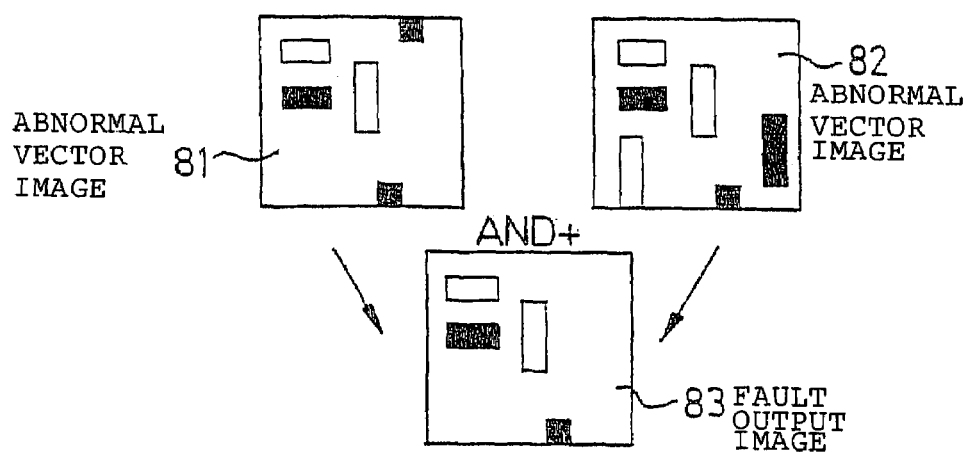
FIGS. 11a, 11b are diagrams illustrating steps of comparison of images of a method according to the invention, in the case of a defective gate with a fault which does not affect the functioning at the output (slight fault)
Figure 11B:
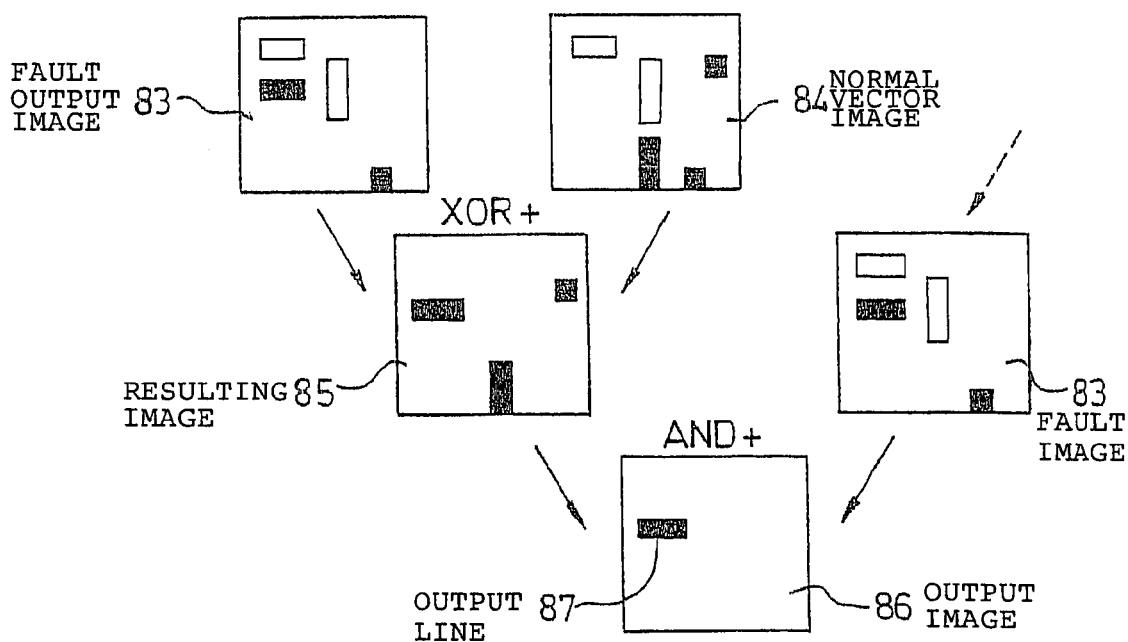

FIGS. 11*a* and 11*b* represent a variant of the invention, which is applicable in the case when the defective circuit is found to be functional at all its output terminals. In this case, the fault is only a slight fault, which is likely to appear again in use, but which cannot be detected according to the prior art, since no output terminal has a fault. In this case, it is not advantageous to use a standard circuit, since the defective circuit has the same functionalities as the standard circuit.

In the step represented in FIG. 11*a*, a comparison is made between at least two abnormal vector images 81, 82, obtained with two distinct abnormal location vectors which belong to the same sequence of location vectors. An image is formed, known as the fault output image 83, representing the equipotential lines which are common to the abnormal vector images 81, 82, and comprising the equipotential output line 87 of the defective logic gate. For this purpose, an extended AND+ intersection is produced between the images 81 and 82, in order to obtain the fault output image 83. Previously, the images 81 and 82 will have been subjected to adaptive thresholding and reduction processing. Also, the image 83 undergoes further reduction processing.

This operation can be repeated with abnormal vector images other than 81 and 82, the extended AND+ intersection of them can be produced, then the extended intersection can be produced of the different fault output images thus obtained, in order, ultimately, to obtain the most accurate fault output image 83 possible, according to the number of abnormal location vectors in the sequence.

In the further step represented in FIG. 11*b*, use is made of the fault output image 83, which is compared by the extended exclusive OR function, XOR+, with a normal vector image 84 obtained with a normal location vector on the same circuit. The resulting image 85 consists of the combination of these two images 83, 84, from which there have been extracted equipotential lines which are common to these two images. There is thus elimination in particular of the equipotential input lines which are not those of the defective logic gate. This extended exclusive OR operation, XOR+, can be repeated, using a plurality of normal vector images 84, and then carrying out the extended AND+ intersection between the different images thus obtained. It should be noted that the normal vector images 84 have previously been subjected to adaptive and reduction thresholding processing.

The image 85 thus obtained is then compared once again with the fault output image 83, by an extended AND+ intersection, such as to form an image, known as the output image 86, which represents the equipotential output line 87 of the defective logic gate.

As previously, before each comparison by extended AND+ intersection, or extended exclusive OR, XOR+, is made, the images are subjected to reduction processing. Similarly, the output image 86 is subjected further to reduction processing.

Figure 12A:
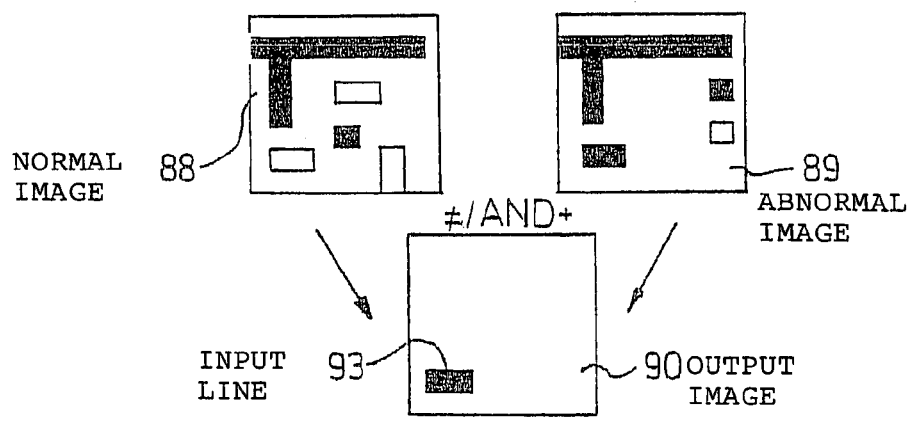
FIGS. 12a and 12b are diagrams illustrating steps of comparison of images of a method according to the invention, applied to the case of a circuit which is without a passivation layer.
Figure 12B:
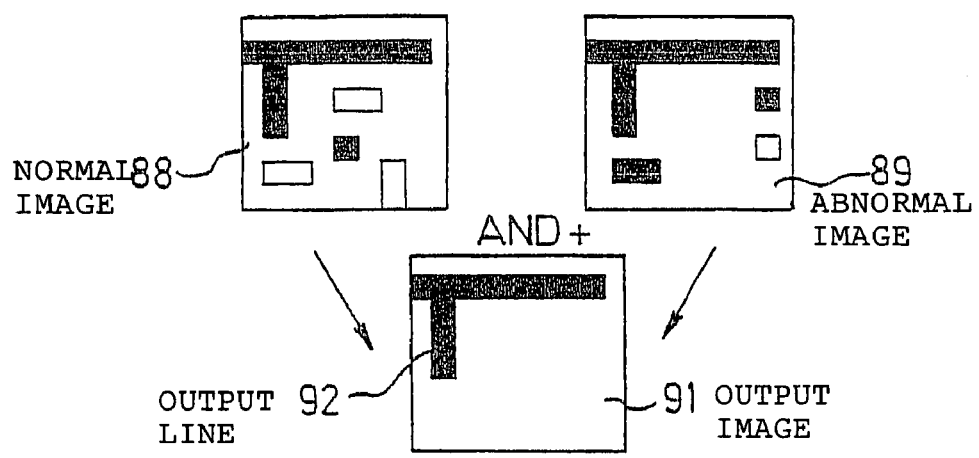

FIGS. 12a and 12b represent a variant of the method according to the invention, for location of a defective logic gate on a circuit which is depassivated or non-passivated. During the step represented in FIG. 12a, the difference is determined between a normal vector image 88 and an abnormal vector image 89, in order to obtain a fault input image 90 which represents the equipotential input line 93 of the defective logic gate. This step can be similar to that represented in FIG. 10a, and can be carried out with a plurality of normal vector images 88, which are then combined by an extended AND+ intersection, as in the case of FIG. 10a. The images which are obtained from each difference are subjected to adaptive thresholding and reduction processing, before the extended AND+ intersection is carried out. The abnormal vector image is preferably obtained with the first abnormal location vector, and the normal vector images can be selected from amongst the images obtained with the previous normal location vectors. The only difference which exists between a non-passivated circuit image and a passivated circuit image is derived from the fact that the equipotential lines for connection to the input and output terminals are visible.

As represented in FIG. 12b, in order to locate the equipotential output line 92 of the defective logic gate, the extended AND+ intersection is produced of the normal vector images 88 and abnormal vector images 89. Previously, these images have been subjected to adaptive thresholding, followed by reduction processing. The image 91 obtained thus represents the equipotential output line 92 of the defective logic gate, as well as the equipotential for connection to the output terminal. On the basis of this image 91, and of the image 90 which represents the equipotential input line 93, it is easy to locate the defective logic gate, as previously described in the case of a passivated circuit.

It should be noted that the invention can be applied equally well to imagery systems other than imagery by electronic microscopy with contrast of potential by detection of secondary electrons. In fact, any imagery system which makes it possible to display the equipotentials by contrast, and supplies images in the form of pixels, can be used.

What is claimed is:

1. A method for location of a fault of the short-circuit type, of a logic gate, known as the defective logic gate, of an integrated circuit, known as the defective circuit, comprising a chip, input terminals and output terminals connected to one another by electrically conductive tracks, and logic gates formed within the chip of the circuit, which is generally in the form of a wafer which defines a main plane of the chip, the tracks extending in the thickness of the chip or on the surface, globally parallel to the main plane, the input and output terminals being connected to the tracks at the periphery of the chip, and at least two electrical energy supply terminals with direct voltage (VDD-VSS), at least one supply terminal of which is connected to a high potential VDD, and at least one supply terminal of which is connected to a low potential VSS, in which:

a) there is creation and recording of a sequence of distinct vectors, known as location vectors, each of which is formed from a series of signals, which are designed to be able to be applied to the different input terminals of the defective circuit, assuming one of the logic states 0 and 1, and maintaining this logic state throughout an entire period in which it is considered that the location vector is applied to the input terminals, such that this sequence can be applied step by step, one location vector after the other, and keeping each location vector applied for a period which is as long as necessary on the input terminals of the defective circuit and/or of a standard circuit, without the electric state of this circuit changing during this duration;

b) after step a), for at least one location vector applied to the input terminals of the defective circuit and/or of an integrated circuit, known as the standard circuit, which is free from a defective gate and from any fault, and is also identical to the defective circuit, a set of images, known as vector images, is produced and recorded, representing equipotential lines formed by the tracks and the logic gates of the said circuit, each equipotential line corresponding to one of the differentiated states of potential on the vector images, the different vector images of a single set of images being designed to cover and represent the entire surface of the chip, or an entire portion of this surface on which it is being attempted to locate the defective logic gate;

c) after step b), the sequence of location vectors is applied step by step to the input terminals of the defective circuit, and for each location vector, measurement is made of the value IDDQ(j) of the electrical consumption current at rest IDDQ of the defective circuit, which is circulating in at least one of the supply terminals, and it is determined whether this value measured IDDQ(j) is normal or abnormal, and the result of this determination is recorded;

d) after step c), at least one location vector, known as the abnormal location vector, is applied to the input terminals of the defective circuit and/or of a standard circuit, for which the fact has previously been determined and recorded that the value measured IDDQ(j) of the electrical consumption current at rest IDDQ of the defective circuit is abnormal, and a set of images, known as abnormal vector images, of the said circuit with this abnormal location vector is produced and recorded; and e) after step d), in a further step of location of the defective gate, at least one comparison is made between at least one abnormal vector image and another pre-recorded image, known as the reference image, corresponding to the same portion of surface of the chip of the defective circuit or of the standard circuit as the abnormal vector image, these images being selected such that this comparison makes it possible to select an area, known as the defective area, of the surface of the chip on which there can be located an equipotential input line of the defective logic gate and/or an equipotential output line of the defective logic gate, and/or the defective logic gate.

2. A method as claimed in claim 1, wherein:

in a first step, the sequence of location vectors is created and recorded;

in a second step, there is application step by step of the sequence of location vectors, to the input terminals of the defective circuit, the value IDDQ(j) is measured of the electrical consumption current at rest IDDQ of the defective circuit, for each location vector, it is determined whether the location vector is abnormal, and this information is recorded;

in a third step, there is selection and recording from amongst the sequence of location vectors, of a list of location vectors which is designed to produce the vector images which make it possible to locate the defective gate by comparison;

in a fourth step, there is application, sequentially, step by step, of the list of location vectors, to the input terminals of the defective circuit and/or of a standard circuit, and a set of vector images for the location of vectors of this list is produced and recorded; and in a fifth step, the step of location of the defective gate is carried out by using the vector images produced in the fourth step.

3. A method as claimed in claim 1, wherein the sequence of location vectors is created such that each location vector is formed by binary signals with the format NRZ, which maintain the same logic state 0 or 1, until a subsequent location vector is applied to the input terminals, or, if the final location vector is involved, until completion of the measurement(s) and production of image(s) carried out for this location vector.

4. A method as claimed in claim 1, wherein the sequence of location vectors is created from a sequence of vectors, known as test vectors, which is previously formed and recorded, and is designed to make it possible to determine the existence only of a defective gate in the defective circuit, by measurement of the value of the electrical consumption current at rest IDDQ of the defective circuit, and each test vector for which the binary signal of at least one input terminal is liable to change its logic state, is broken down into a plurality of location vectors, the logic state of the binary signals of which does not change.

5. A method as claimed in claim 1, wherein the sequence of location vectors is created such that two consecutive location vectors are distinguished from one another by the value of a single binary signal applied to a single input terminal.

6. A method as claimed in claim 1, wherein, in order to measure the value of the electrical consumption current at rest IDDQ of the defective circuit, at least one supply terminal of the defective circuit is applied to the input of an amplifier circuit which is fitted as a current/voltage converter.

7. A method as claimed in claim 6, wherein the supply terminal of the defective circuit which is connected to a low potential VSS is used, and the amplifier circuit fitted is a current/voltage converter, and is designed to create a virtual memory, which is adjustable according to the constraints imposed by the supply of the integrated circuit on which the value of the current IDDQ is measured.

8. A method as claimed in claim 7, wherein it is determined whether the value measured IDDQ(j) is normal or abnormal, by comparing it with a known nominal electrical consumption current at rest IDDQnom of the defective circuit.

9. A method as claimed in claim 1, wherein it is determined whether the value measured IDDQ(j) is normal or abnormal, by calculating the standardised difference:

$D=[IDDQ(j)-IDDQ^0(j)]/\text{maximum}[IDDQ^0(j), Imin]$ in which

IDDQ(j) is the value measured of the electrical consumption current at rest IDDQ, of the defective circuit with the test vector j;

$IDDQ^0(j)$ is the value measured of the electrical consumption current at rest IDDQ, of a standard circuit; and Imin is a minimum current value which is pre-determined in order to eliminate the effects of noise, the value IDDQ(j) being considered to be abnormal if D is greater than a pre-determined threshold value DS.

10. A method as claimed in claim 9, wherein DS is selected between 2 and 100.

11. A method as claimed in claim 1, wherein, after a first comparison has been made, in which at least one defective area of the surface of the chip has been selected, at least one further comparison is made, only from vector images which correspond to the said defective area.

12. A method as claimed in claim 1, wherein, for an abnormal location vector, a comparison is made of two sets of images of the defective circuit and/or of a standard circuit, at least one of the two sets of images being a set of vector images which is obtained with the said abnormal location vector, such as to select a defective area in which the defective logic gate can be located, and a further comparison is subsequently made only with the sets of vector images which represent the said defective area.

13. A method as claimed in claim 1, wherein, during a first comparison of the step of location of the fault, the abnormal vector image used for the image is at least one vector image of a set of vector images, obtained with the first abnormal location vector appearing first in the sequence of location vectors.

14. A method as claimed in claim 13, wherein the electrical functionality of the defective circuit is tested, and, if the defective circuit is found to be non-functional as far as one output terminal at least is concerned, as the reference image, use is made of a vector image, known as the fault reference image, obtained with the defective circuit for a location vector, known as the normal location vector, for which the value measured of the consumption current at rest IDDQ of the defective circuit, is normal.

15. A method as claimed in claim 14, wherein the fault reference image used is a vector image which is obtained with the defective circuit, in the same sequence of location vectors, with a location vector which precedes the abnormal location vector.

16. A method as claimed in claim 15, wherein, for a comparison, the abnormal vector image used is a vector image, known as the fault abnormal vector image, of the defective circuit, and, in order to compare the fault abnormal vector image and the fault reference image, an image is formed, known as the simple fault input image, representing the equipotential lines of the defective circuit which have the same form and the same location, and states of potential which differ between the fault abnormal vector image and the fault reference image, such as to be representative of the equipotential input line of the defective logic gate.

17. A method as claimed in claim 16, wherein a plurality of simple fault input images is formed from a single fault abnormal vector image, which is compared with a plurality of fault reference images, and an image is formed, known as the intersection fault input image, representing the equipotential lines which are common amongst the different simple fault input images.

18. A method as claimed in claim 16, wherein, during a further comparison, an image is formed, known as the output image, representing the equipotential lines which appear on a simple fault input image or on an intersection fault input image, or on a simple standard input/output image, or on an intersection standard input/output image; with the exclusion of the equipotential lines which are common amongst these images, this output image representing the equipotential output line of the defective logic gate, and its propagation in the defective circuit.

19. A method as claimed in claim 18, wherein there is division of an intersection or simple fault input image and an output image representing the same portion of surface of the chip, in adjacent rectangular windows which have the same predetermined fixed dimensions, which are smaller than those of these images, for each window it is examined whether each of the two images does or does not have at least one equipotential line, and the window(s) having at least one equipotential line in each of these two images is/are selected and recorded.

20. A method as claimed in claim 14, wherein, during the step of location of the defective gate, at least one comparison is made between two images of a standard circuit formed from an abnormal vector image, known as the standard abnormal vector image, obtained by applying an abnormal location vector to this standard circuit, and from a reference image, known as the standard reference image, obtained by applying a normal location vector to the standard circuit.

21. A method as claimed in claim 20, wherein, on the basis of the standard abnormal vector image and the standard reference image, an image is formed, known as the simple standard input/output image, representing the equipotential lines of the standard circuit which have the same form and the same location, and states of potential which differ between the standard abnormal vector image and the standard reference image, such as to be representative of the equipotential input line and the equipotential output line of the defective logic gate of the defective circuit.

22. A method as claimed in claim 21, wherein a plurality of simple standard input/output images is formed from a single standard abnormal vector image which is compared with a plurality of standard reference images, and an image is formed, known as the intersection standard input/output image, representing the equipotential lines which are common amongst the different simple standard input/output images.

23. A method as claimed in claim 1, wherein the electrical functionality of the defective circuit is tested, and, if the defective circuit is found to be functional for all the output terminals, a comparison is made between at least one first abnormal vector image obtained with a first abnormal location vector, and at least one second abnormal vector image obtained with the same circuit, and with a second abnormal location vector which is distinct from the first abnormal location vector, the first and second abnormal location vectors belonging to the same sequence of location vectors.

24. A method as claimed in claim 23, wherein an image is formed, known as the fault output image, representing the equipotential line(s) which is/are common to the different abnormal vector images, comprising the equipotential output line of the defective logic gate.

25. A method as claimed in claim 24, wherein, in a further comparison, an image is formed, known as the intermediate output image, representing the equipotential lines which appear in common on the fault output image and on at least one normal vector image obtained with a normal location vector, with the exclusion of the equipotential lines which are common to this fault output image and this normal vector image, the said intermediate output image comprising the equipotential output line of the defective logic gate.

26. A method as claimed in claim 25, wherein, in a further comparison, an image is formed, known as the output image, which represents the equipotential lines common to the fault output image and to the intermediate output image, the said output image representing the equipotential output line of the defective logic gate.

27. A method as claimed in claim 1, wherein the test images are produced by electronic scanning microscopy with contrast of potential, by detection of the secondary electrons.

28. A method as claimed in claim 1, wherein the vector images are recorded in monochrome pixelised form, and each comparison is made between images in pixelised form, numerically, pixel by pixel.

29. A method as claimed in claim 28, wherein, before using an image in an image comparison step, this image is previously integrated onto a plurality of identical exposures which correspond to this image, and median filtering is carried out by allocating to each pixel the median value of the series of pixels comprising this pixel and the pixels which surround it, such as to eliminate the peaks caused by the noise.

30. A method as claimed in claim 28, wherein, in order to form an image representing the equipotential lines which have the same form and the same location, and states of potential which differ between two initial images, a difference in the two initial images is produced pixel by pixel, according to the formula:

$$PC=(PA-PB)/2+INT(E/2)$$

in which PA is the value of the contrast level of the pixel of the first input image; PB is the value of the contrast level of the pixel of the second input image; E is the maximum value of the contrast level of the images; PC is the value of the contrast level of the pixel of the image formed; and INT is the whole part function.

31. A method as claimed in claim 28, wherein, in order to form an image representing the common equipotential lines which are common to two initial images, there are carried out:
  a thresholding step, which adapts to three contrast levels, i.e. white, black and grey; and
  pixel by pixel, an extended AND+ intersection, during which the following contrast levels are allocated to each pixel of the image to be formed;
  black, if the two pixels of the initial images are black on completion of the adaptive thresholding;
  white, if the two pixels of the initial images are white on completion of the adaptive thresholding; and
  grey in all the other cases.

32. A method as claimed in claim 28, wherein, in order to form an image which represents the equipotential lines of one or the other of two initial images, with the exclusion of the equipotential lines which are common to these two initial images, there are carried out:
  a thresholding step, which adapts to three contrast levels, i.e. white, black and grey; and
  pixel by pixel, an extended exclusive OR comparison, XOR+, during which the following contrast levels are allocated to each pixel of the image to be formed:
  grey, if the two pixels of the initial images have the same contrast value on completion of the adaptive thresholding;
  white, if the two pixels of the initial images are white and grey; or white and black; or grey and black, on completion of the adaptive thresholding; and
  black, if the two pixels of the initial images are black and grey; or black and white; or grey and white.

33. A system for location of a fault of the short-circuit type, in a logic gate, known as the defective logic gate, of an integrated circuit, known as the defective circuit, comprising a chip for the input terminals and output terminals, which are connected to one another by electrically conductive tracks and logic gates formed within the chip of the circuit, which is generally in the form of a wafer defining a main plane of the chip, the tracks extending in the thickness of the chip or on the surface, globally parallel to the main plane, the input and output terminals being connected to the tracks at the periphery of the chip, and at least two electrical energy supply terminals with direct voltage (VDD-VSS), at least one supply terminal of which is connected to a high potential VDD, and at least one supply terminal of which is connected to a low potential VSS, the said installation comprising:

means for creating and recording a sequence of distinct vectors, known as location vectors, each of which is formed from a series of binary signals, which are designed to be able to be applied to the different input terminals of the defective circuit, assuming one of the logic states 0 and 1, and maintaining this logic state throughout an entire period, in which it is considered that the location vector is applied to the input terminals;

equipotential imagery means, which, for at least one location vector applied to the input terminals of the defective circuit and/or of an integrated circuit, known as the standard circuit, which is free from a defective gate and from any fault, and is also identical to the defective circuit, can produce and record a set of images, known as vector images, representing equipotential lines formed by tracks and the logic gates of the said circuit, each equipotential line corresponding to one of the differentiated states of potential on the vector images, the different vector images of a single set of images being designed to cover and represent the entire surface of the chip, or an entire portion of this surface on which it is being attempted to locate the defective logic gate, means for applying the sequence of location vectors step by step to the input terminals of the defective circuit;

for each location vector, means for measurement of the value IDDQ(j) of the electrical consumption current at rest IDDQ of the defective circuit, which is circulating in at least one of the supply terminals;

means for calculation which can determine whether this value measured IDDQ(j) is normal or abnormal, and can record the result of this determination; and means for calculation, which can make at least one comparison between at least one abnormal vector image and another pre-recorded image, known as the reference image, corresponding to the same portion of surface of the chip of the defective circuit or of the standard circuit as the abnormal vector image, these images being selected such that this comparison makes it possible to select an area, known as the defective area, of the surface of the chip on which there can be located an equipotential input line of the defective logic gate and/or an equipotential line of the defective logic gate, and/or the defective logic gate.

34. A system as claimed in claim 33, wherein the means for measurement of the value of the electrical consumption current at rest IDDQ of the circuit comprise an amplifier circuit which is fitted as a current/voltage converter.

35. A system as claimed in claim 34, wherein the amplifier circuit fitted as a current/voltage converter is designed to create a virtual memory, which is adjustable according to the constraints imposed by the supply of the integrated circuit.

* * * * *